United States Patent
Namekawa et al.

(10) Patent No.: US 6,744,680 B2
(45) Date of Patent: Jun. 1, 2004

(54) SEMICONDUCTOR DEVICE REALIZED BY USING PARTIAL SOI TECHNOLOGY

(75) Inventors: Toshimasa Namekawa, Tokyo (JP); Shinji Miyano, Yokohama (JP); Atsushi Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/342,248

(22) Filed: Jan. 15, 2003

(65) Prior Publication Data

US 2003/0123273 A1 Jul. 3, 2003

Related U.S. Application Data

(62) Division of application No. 10/115,977, filed on Apr. 5, 2002, now Pat. No. 6,529,399.

(30) Foreign Application Priority Data

Dec. 28, 2001 (JP) ........................................ 2001-401302
Feb. 27, 2002 (JP) ........................................ 2002-051882

(51) Int. Cl.[7] ................................................. G11C 7/00
(52) U.S. Cl. ....................................... 365/194; 365/233
(58) Field of Search ................................ 365/194, 233, 365/63; 327/276, 281

(56) References Cited

U.S. PATENT DOCUMENTS

| 5,740,099 | A |   | 4/1998 | Tanigawa ..................... 365/51 |
| 5,768,177 | A | * | 6/1998 | Sakuragi ..................... 365/194 |
| 5,946,268 | A | * | 8/1999 | Iwamoto et al. ............. 365/233 |
| 6,310,505 | B1 | * | 10/2001 | Ogawa et al. ............... 327/276 |
| 6,483,749 | B1 |   | 11/2002 | Choi et al. ............. 365/185.18 |

OTHER PUBLICATIONS

Paul DeMone, et al., "A 6.25 ns Random Access 0.25 μm Embedded DRAM", 2001 Symposium on VLSI Circuits Digest of Technical Papers, 4–89114–013–5.

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor substrate has a bulk region and a semiconductor region formed either on a buried insulating film or on a cavity region. The bulk region contains a plurality of memory cells, sense amplifiers and column selection gates, while the semiconductor region contains word line selection circuits and column selection circuits.

12 Claims, 21 Drawing Sheets

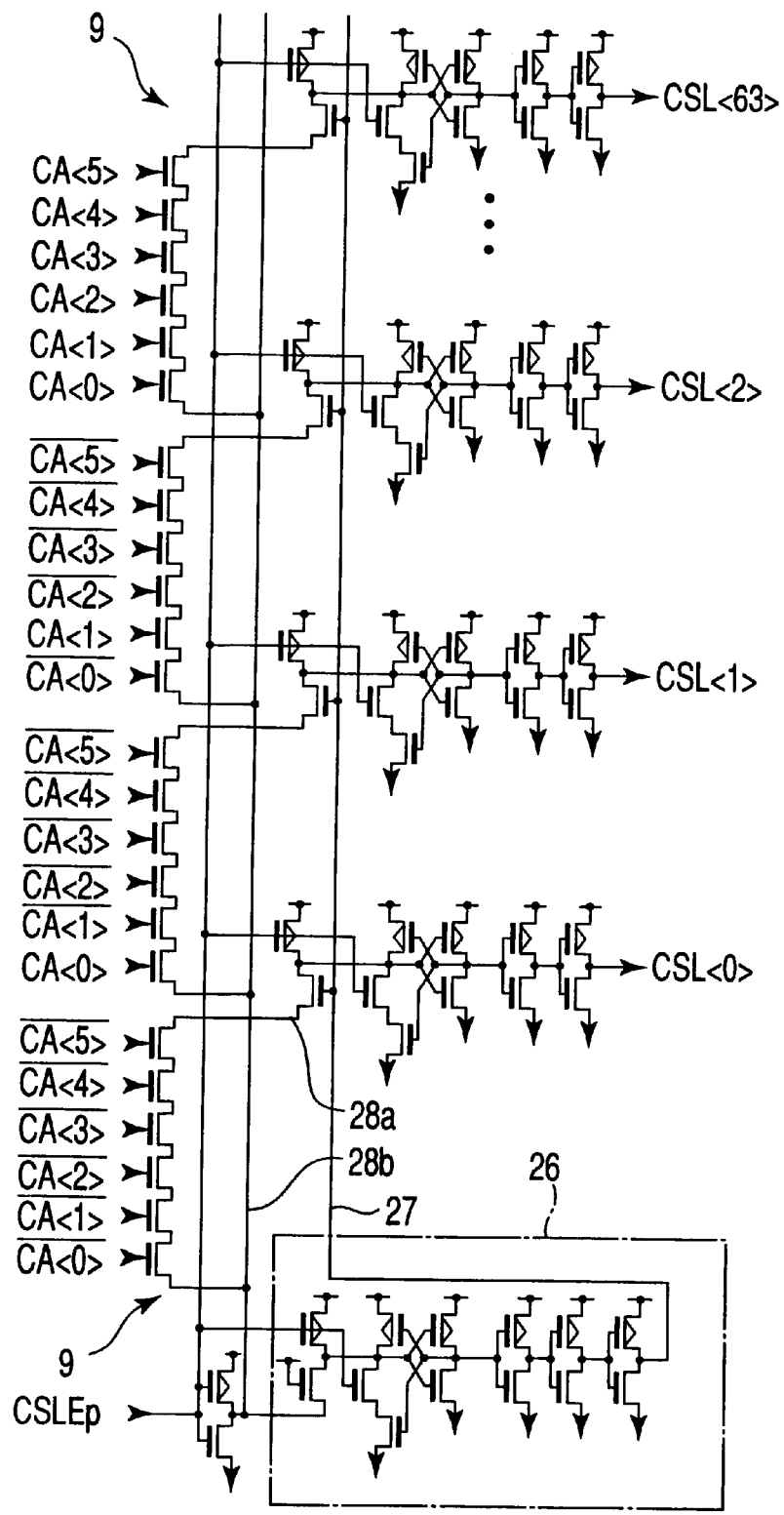
F I G. 3

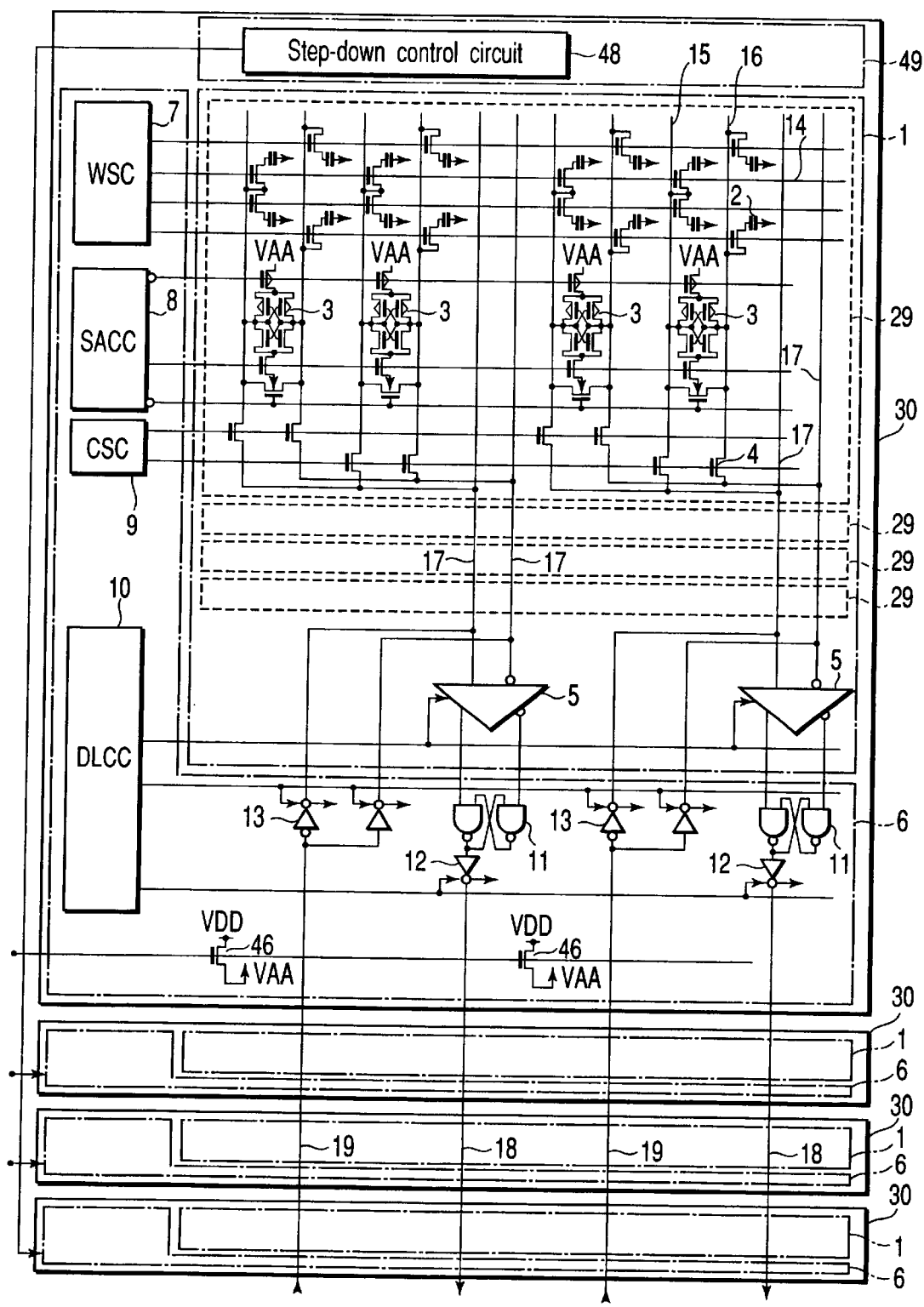
F I G. 16

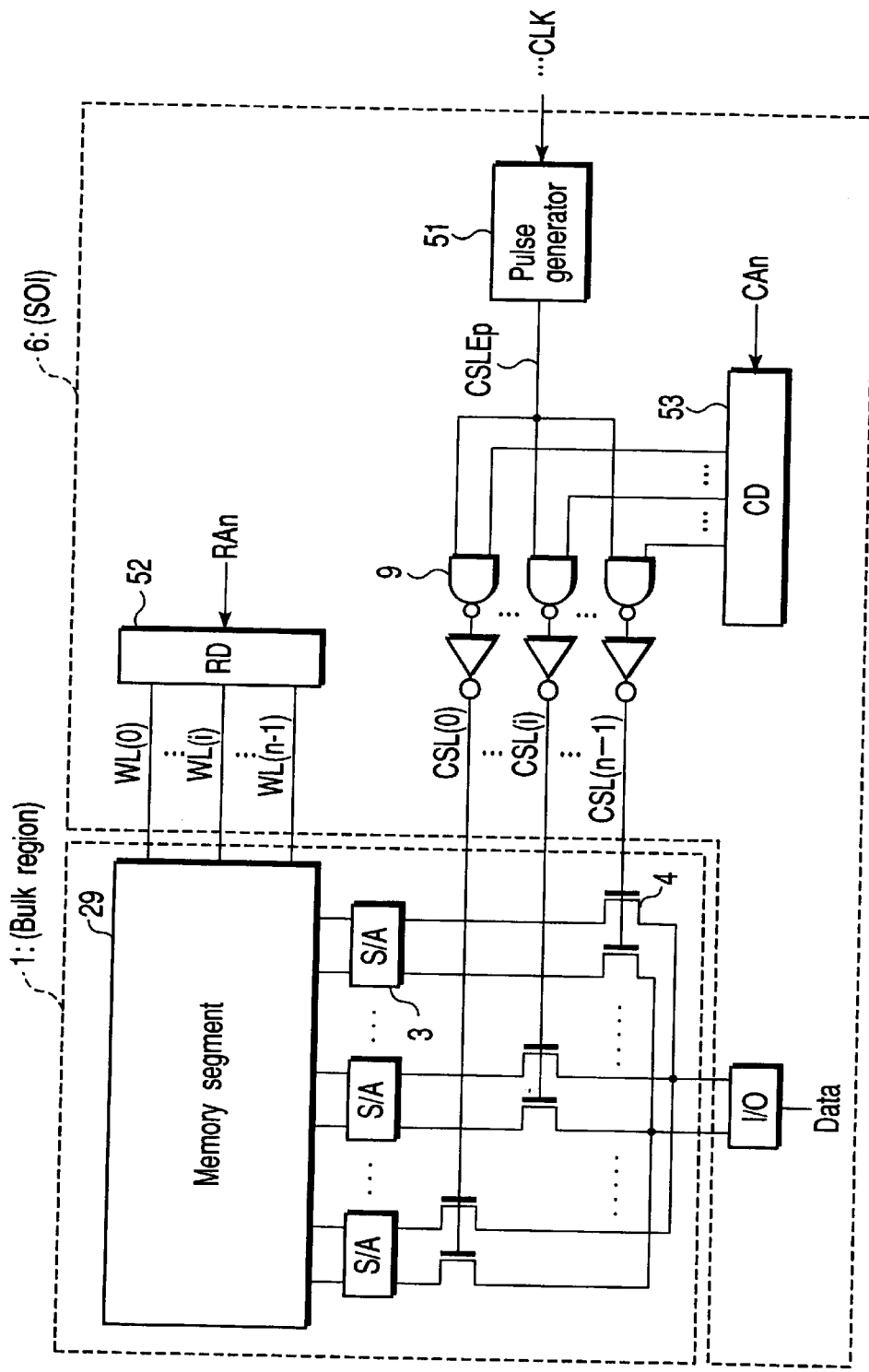
F I G. 19

X: "High" or "Low"

SEMICONDUCTOR DEVICE REALIZED BY USING PARTIAL SOI TECHNOLOGY

This application is a Division of application Ser. No. 10/115,977 filed on Apr. 5, 2002, now U.S. Pat. No. 6,529,399, issued on Mar. 4, 2003.

CROSS-REFERENCE TO RELATED APPLICATIONS

This application is based upon and claims the benefit of priority from the prior Japanese Patent Applications No. 2001-401302, filed Dec. 28, 2001; and No. 2002-051882, filed Feb. 27, 2002, the entire contents of both of which are incorporated herein by reference.

BACKGROUND OF THE INVENTION

1. Field of the Invention

This invention relates to a semiconductor device realized typically by using SOI (silicon on insulator) or SON (silicon on nothing) technology.

2. Description of the Related Art

Efforts have been paid in recent years to utilize SOI technology for manufacturing semiconductor devices in order to realize a high speed operation for electronic devices. MOS transistors formed on the surface of an SOI substrate (to be referred to as an SOI element hereinafter) show characteristic features including a large high current drivability, a small junction capacity and non-existence of back gate effect. Thus, a high speed circuit operation can be realized by utilizing these characteristic features.

However, particularly, a PD-SOI element that operates in a state of partial depletion shows such a hysteresis that the static characteristics of the transistor can vary depending on the immediately preceding operating condition thereof. Therefore, when a transfer gate of a memory cell is formed by using an SOI element, its cutoff performance is degraded to in turn degrade the data holding performance of the memory cell. Additionally, paired SOI elements can hardly operate properly. Thus, it is very difficult to form complementary latch circuits and operational amplifiers by using an SOI element.

Meanwhile, the merged DRAM technology of merging logic circuits and DRAMs on a single chip has been attracting attention in recent years. Using this technology, it is possible to arrange large capacity memory devices and logic circuits on the same chip. Additionally, the merged DRAM technology makes it possible to connect an arithmetic and logic unit and a memory device by means of a data path having a large bus width, in order to realize a high speed operation. However, a DRAM is normally made to comprise a large number of transfer gates and complementary circuits and, as pointed out above, it is difficult to form transfer gates and complementary circuits by using SOI elements. Thus, it has been believed that it is difficult to manufacture DRAMs by using SOI technology.

Recently, there has been proposed a technique of forming a DRAM by producing a bulk region in part of an SOI wafer. This technique is referred to as partial SOI. More specifically, it is a semiconductor manufacturing technique of forming an opening in part of an SOI wafer and subsequently closing the opening by growing monocrystalline silicon in the opening to produce a bulk region there. When using this technique, it is necessary to provide a buffer region of several micrometers along the border of the SOI region and the bulk region. Additionally, the bulk regions of a chip are required to be uniformized in terms of shape and size in order to grow good quality monocrystalline silicon.

It may be easy to design and manufacture a merged DRAM chip having logic circuits by using the partial SOI technique and forming the entire DRAM macro as a large bulk region. However, such a design concept by turn gives rise to the problems as pointed out below. Firstly, with such a design concept, it is not possible to exploit the advantages of an SOI element in order to improve the performance of the DRAM macro itself.

Secondly, the capacity and the configuration of the DRAM macro are restricted when the bulk regions are uniformized in terms of shape and size. A highly integrated high performance semiconductor device that is referred to as "system on chip type" is formed by putting a large number of versatile functional blocks together. Each functional block is required to have a memory macro showing an optimal capacity and an optimal configuration and designed to operate optimally. Recently, merged DRAM macros whose memory capacity ranges between 1 Mbit and 128 Mbits are commercially available to meet the requirement. Additionally, available data bus width ranges between 64 bits and 256 bits and hence it is possible to select an appropriate data bus width depending on the application. Furthermore, DRAM macros having parity bits as many as 144 bits are also available. High speed DRAMs having an access time as short as 5 ns have been proposed recently. The area and the shape of a DRAM macro can vary depending on its capacity and the configuration. They can also vary depending on its operating speed. This means that bulk regions with different shapes and areas need to be provided. However, providing bulk regions with different shapes and areas is a costly operation because the manufacturing process needs to be optimized for each shape and each area of bulk region. Therefore, it may not be wise to form bulk regions having different areas and shapes on the same chip. Manufacturing chips, each having bulk regions with different shapes and areas, can end up with an extremely low yield. The subject was described about the partial SOI technique. However, the partial SON has the same subject as the partial SOI technique. Thus, there is a demand for semiconductor devices manufactured by using the partial SOI or SON technique and comprising circuits that show desired operating characteristics.

BRIEF SUMMARY OF THE INVENTION

According to an aspect of the invention, there is provided a semiconductor device comprising: a bulk region formed in a semiconductor substrate; and a semiconductor region formed on one of a buried insulating film in the semiconductor substrate and a cavity region formed in the semiconductor substrate; the bulk region including: a memory cell array having a plurality of memory cells arranged in the form of a matrix and including a plurality of memory cells connected to bit lines and word lines; sense amplifier connected to the bit lines of the memory cell array, the sense amplifier being adapted to sense and amplify the potentials of the bit lines; and column selection gate for connecting the sense amplifier to first data line; the semiconductor region including: word line selection circuit for selecting appropriate ones of the word lines; and column selection circuit for selecting appropriate ones of the column selection gate.

According to another aspect of the invention, there is provided a semiconductor device formed in a region other than the bulk region within a semiconductor substrate, the device comprising: a delay circuit adapted to be supplied with a clock signal and delay the clock signal; a logic circuit adapted to be supplied with the output signal of the delay circuit and the clock signal; the delay circuit including: an inverter circuit for receiving the clock signal; a capacitor to be charged and discharged in response to the operation of the inverter circuit; and a transistor connected to the capacitor and the output terminal of the inverter circuit, the transistor being turned off in response to a fall of the output voltage of the inverter circuit under the threshold voltage of the inverter circuit.

BRIEF DESCRIPTION OF THE SEVERAL VIEWS OF THE DRAWING

FIG. 3 is a schematic circuit diagram of column selection circuits that can be used for the embodiment of FIG. 1;

FIG. 16 is a schematic circuit diagram of the fifth embodiment of the invention;

FIG. 19 is a schematic block diagram of the sixth embodiment of the invention, illustrating its configuration;

DETAILED DESCRIPTION OF THE INVENTION

Figure 1:
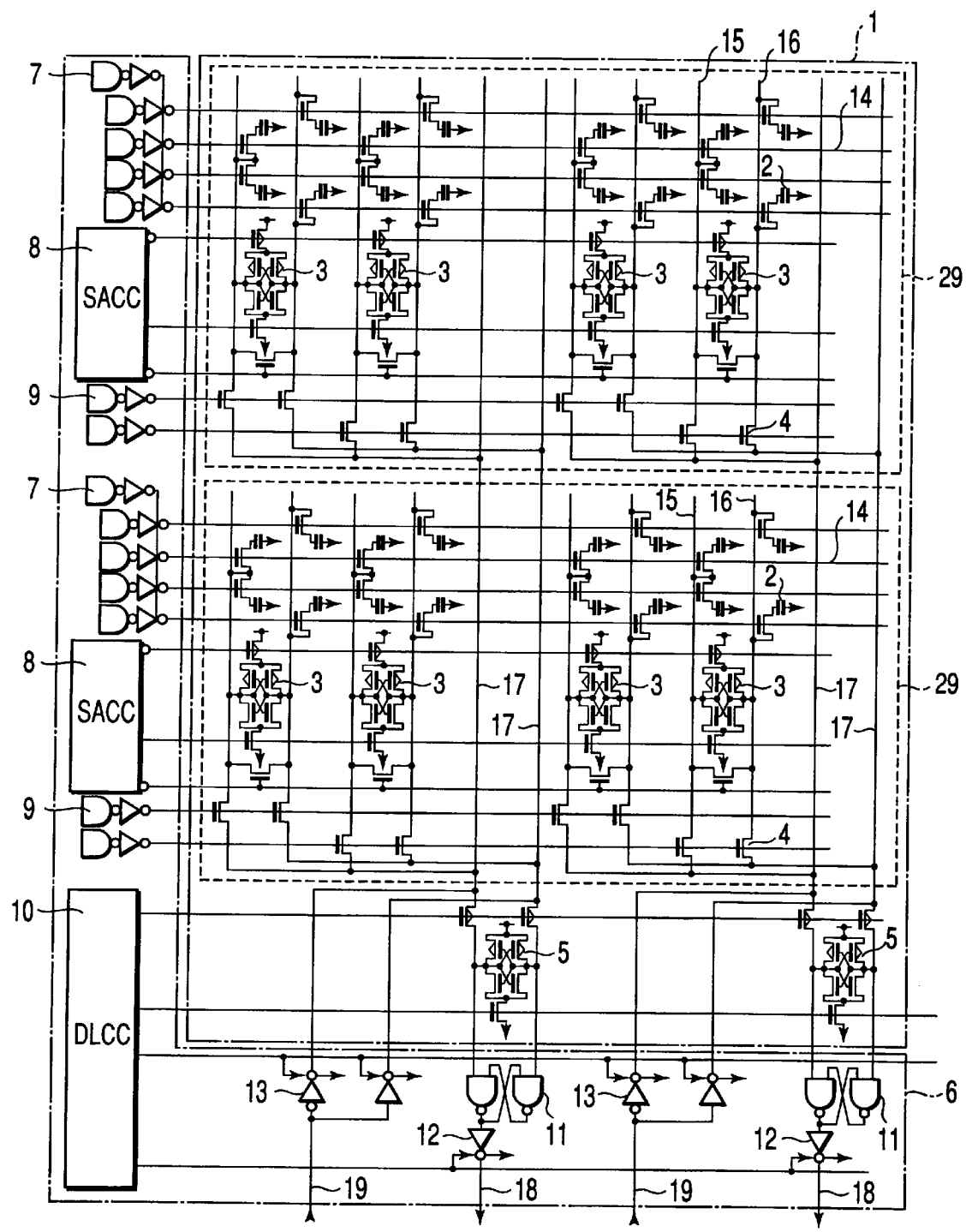
FIG. 1 is a schematic circuit diagram of the first embodiment of the invention.

Now, the present invention will be described by referring to the accompanying drawing that illustrates preferred embodiments of the invention. Throughout the drawing, the same components are denoted respectively by the same reference symbols.

(1st Embodiment)

FIG. 1 is a schematic circuit diagram of the first embodiment of the invention. Referring to FIG. 1, a bulk region 1 and an SOI region 6 are formed in a semiconductor substrate (not shown). The bulk region 1 has a substantially rectangular shape, while the SOI region 6 is arranged along two of the four sides of the bulk region 1. The bulk region 1 typically contains a plurality of memory segments 29 and a plurality of sub-data line sense amplifiers 5. Each memory segment 2 in turn contains a plurality of DRAM cells 2, a plurality of sense amplifiers 3 for amplifying the potentials of bit lines and a plurality of column selection gates 4. The DRAM cells 2 are arranged in the form of a matrix to produce a memory cell array.

On the other hand, the SOI region 6 typically contains a plurality of word line selection circuits 7, a plurality of sense amplify control circuits (SACCs) 8, a plurality of column selection circuits 9, a data line access control circuit (DLCC) 10, a plurality of data latch circuits 11, a plurality of main data line drive circuits 12 and a plurality of sub-data line drive circuits 13.

In each memory segment 29, one of the DRAM cells 2 arranged in the form of a matrix may be selected by means of a word line 14 and the selected DRAM cell 2 is connected to either of a pair of bit lines 15, 16. The pairs of bit lines are connected to respective sense amplifiers 3. Each sense amplifier 3 is adapted to amplify the very small potential difference that may be produced between the pair of bit lines 15, 16 connected to it and, at the time of restoring data, charge the bit lines to a full potential to rewrite the data in the DRAM cell 2. Subsequently, the column selection gate 4 selected by the column selection circuits 9 operate and the pair of bit lines 15, 16 are connected to a corresponding pair of sub-data lines 17.

The pairs of bit lines 15, 16 are arranged at the smallest possible pitch that can be realized by lithography in order to realize a high degree of integration. On the other hand, the pairs of sub-data lines 17 are arranged in a wiring region located above the bit lines so as to allow a large wire width for high speed operation. For example, 128 pairs of sub-data lines may be arranged for 1,024 pairs of bit lines.

Each pair of sub-data lines 17 are connected to a sub-data line sense amplifier 5, which amplifies the very small potential difference that may be produced between the pair of bit lines 15, 16 connected to it. The output signal of the sub-data line sense amplify 5 is held in a corresponding data latch circuit 11. The data held in the data latch circuit 11 is then transmitted to a corresponding read-out main data line 18 by way of a main data line drive circuit 12 comprising a tri-state buffer 12. In a write operation, one of the sub-data line drive circuits 13 receives a write data from a corresponding write-in main data line 19 and charges the corresponding sub-data lines 17 to a full potential. The potential of the sub-data lines 17 forcibly inverts the state of the corresponding sense amplifiers 3 by way of the corresponding column selection gates 4.

The DRAM cells 2 and the column selection gates 4 are transfer gates. A good cut off performance can not be realized when the transistors of the transfer gates are formed in the SOI region 6 due to the substrate floating effect. Therefore, the DRAM cells 2 and the column selection gates 4 are formed in the bulk region 1. On the other hand, the sense amplifiers 3 and the sub-data line sense amplifiers 5 are formed of complementary latch circuits to amplify a very small potential difference by means of an analog operation. Such complementary circuits can not show a good amplifying performance when they are formed in the SOI region 6 because the transistors formed in the SOI region 6 show a hysteresis that the circuit characteristics can vary depending on the immediately preceding potential condition thereof. Therefore, both the sense amplifiers 3 and the sub-data line sense amplifiers 5 are formed in the bulk region 1.

The remaining circuits are formed in the SOI region 6 in order to exploit the advantages of an SOI element including the high density that is possible due to the unrequited well regions, the high current drivability due to the substrate floating effect and the low source/drain capacity due to the non-existence of PN junction in areas other than the channel regions.

Some of the advantages of utilizing an SOI element for circuits other than the memory segments 29 will be described further.

Figure 2:
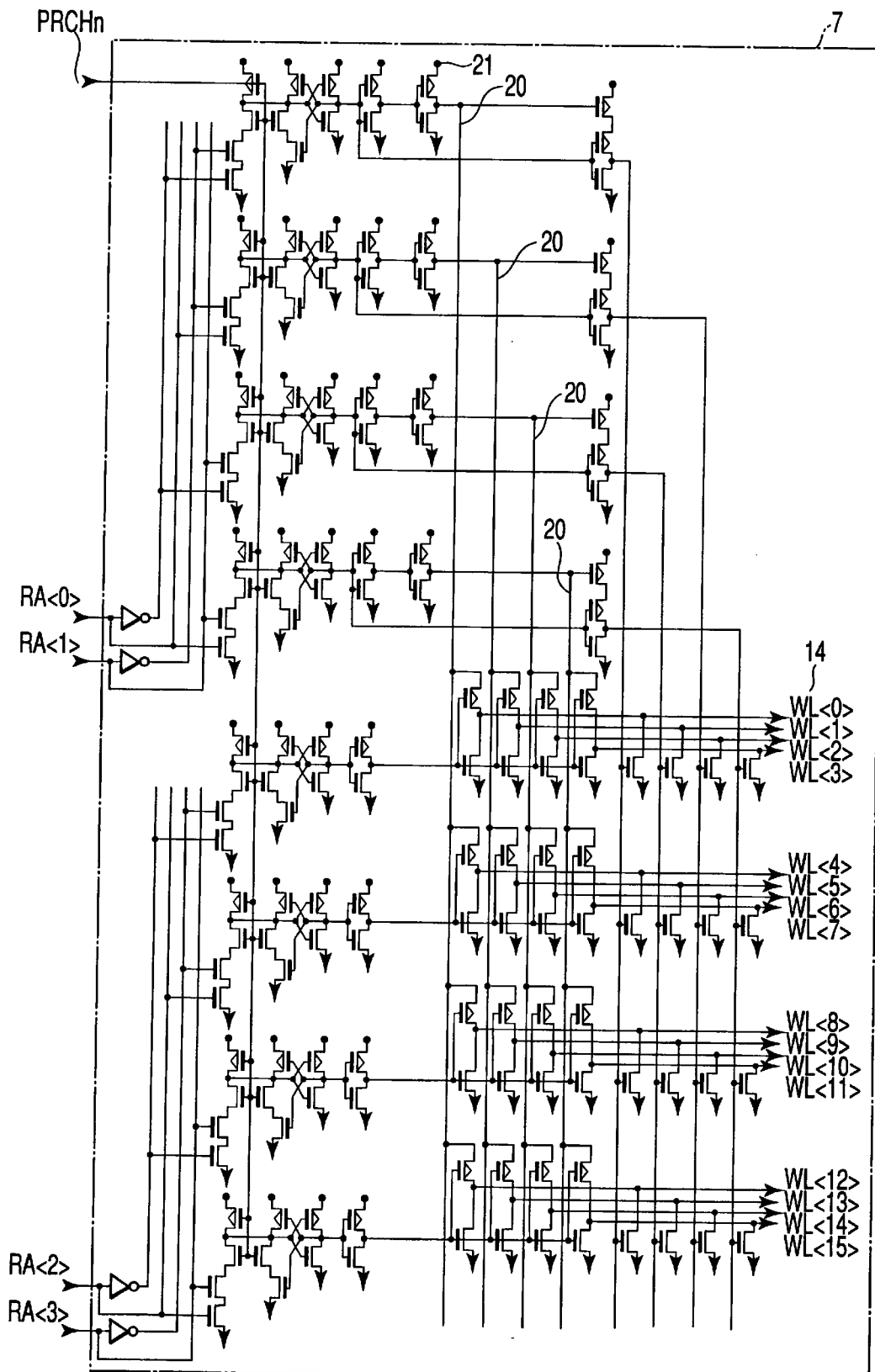
FIG. 2 is a schematic circuit diagram of a word line selection circuit that can be used for the embodiment of FIG. 1.

FIG. 2 is a schematic circuit diagram of a word line selection circuit 7 that can be used for the embodiment of FIG. 1. Normally, each DRAM cell is formed by an N-channel MOS transistor (to be referred to as an NMOS transistor hereinafter) and a capacitor in order to realize a high degree of integration. When the DRAM cell is in a selected state, the storage node of the capacitor and the bit lines need to be connected in a good condition. For this reason, a voltage higher than the supply voltage is applied to the word line selection circuit from a booster power source 21. The use of an SOI element is advantageous for a circuit requiring such a supply voltage and other power source because the SOI element does not need any well.

Additionally, a large number of memory cells are normally connected to a word line. In the case of a cell array of 1 Mbit, for example, 2K memory cells are connected to a single word line. Then, the capacity of a word line will be about 1 pF including the wire capacity. The word line selection circuit is required to have a high current drivability for high speed operation. From this point of view, the use of an SOI element that can make a word line selection circuit have a high current drivability per unit gate width is advantageous.

Still additionally, word lines are normally arranged at the smallest possible pitch that can be realized by lithography in order to realize a high degree of integration. Then, the circuits for driving the word lines also need to be arranged at a small pitch. For this reason, an AND circuit having a unique circuit configuration as shown in FIG. 2 may be used for the word line drive circuit. With such an arrangement, the sources of a large number of transistors are connected to each selection source node 20. In the case of a cell array of 1 Mbit, the number of word lines will be as may as 512. Then, if four source nodes 20 are provided as shown in FIG. 2, 128 source terminals will be connected to each source node 20. When the word line drive circuit is formed by using a bulk element, the parasitic capacitance of the selection source nodes 20 will be as much as 5 pF, which obstructs any efforts for high speed operation and low power consumption for the circuit. On the contrary, the use of an SOI element for such a word line selection circuit can effectively suppress the junction capacitance and hence is advantageous for high speed operation and/or low power consumption.

FIG. 3 is a schematic circuit diagram of column selection circuits 9 that can be used for the embodiment of FIG. 1. For the sake of convenience of description, only four column selection circuits 9 are shown in FIG. 3, although about 16 to 256 column selection circuits will normally be provided for a DRAM. If a DRAM comprises 64 column selection circuits, 6 bits column addresses will be required to select one of them. The column selection circuits 9 of FIG. 3 are formed by using domino circuits. Each domino circuit of FIG. 3 comprises six NMOS transistors that constitute a NAND circuit having six inputs. A total of 6-bit column addresses CA <0> through CA <5> or inverted signals thereof are supplied to each 6-input NAND circuit. A potential is applied to an end of the current path of each NAND circuit as a function of the pulse signal 27 output from a delay circuit 26. When a column is not selected, the column selection timing signal CSLEp applied to it shows a low potential and the pulse signal 27 output from the delay circuit 26 shows a high potential. Therefore, the source electrode 28a of each column selection circuit 9 is charged to a high potential.

As the potential of the column selection signal CSLEp is raised, the potential of the drain electrode 28b of the 6-input is shifted from the high level to the low level. At this time, all the six NMOS transistors of the column selection circuit 9 that are selected by means of column address are brought into an electrically conducting state. As a result, the potential of the selected one of the column selection signals CSL <0> through CSL <63> is raised to the high level. Thereafter, the potential of the selected one of the column selection signals CSL <0> through CSL <63> is held to the high level during the period when the column selection timing signal CSLEp is at the high potential level. However, the potential of the selected one of the column selection signals CSL <0> through CSL <63> is brought down to the low level as the column selection timing signal CSLEp is brought down to the low potential level.

On the other hand, the outputs of the column selection circuits 9 that are not selected by the column address are always held to the low potential level. The output signal 27 of the delay circuit 26 is brought down to the low potential level after the potential of the column selection timing signal CSLEp is raised to the high level and subsequently the column selection signals CSL <0> through CSL <63> are brought up to the high potential level. Therefore, the column addresses CA <0> through CA <5> are taken into the column selection circuits 9 for a very short period of time between the rise of the potential of the column selection timing signal CSLEp and the fall of the potential of the output signal 27 of the delay circuit.

The domino circuits constituting the column selection circuits 9 are adapted to realize high speed operation with a limited number of elements. However, when a multi-input NAND circuit whose number of inputs is as many as six is formed by using ordinary bulk elements, the potential of the drain terminals 28a of the NMOS transistors arranged above and connected to them can be floating high. Then, the back gate effect appears to extremely reduce the current drivability of the circuit. Additionally, the operation of the circuit has to wait until the parasitic junction capacity of the intermediary terminals of the multi-input NMOS transistors that are arranged and connected in stages is fully charged and discharged to make it a very slow operation. At worst, there can arise a problem that a column selection signal is output from a column selection circuit 9 by the charging current of the junction capacity although the input column address is in an unselected state.

On the other hand, when a multi-input NAND gate is formed by using SOI elements, no back gate effect appears in them. Additionally, since the junction capacity of an SOI element is very small, no problem arises due to the charging current of the intermediary terminals. In other words, no operation error occurs and the column selection circuits that can operate at high speed can be formed with a limited number of elements by using SOI elements.

Figure 4:
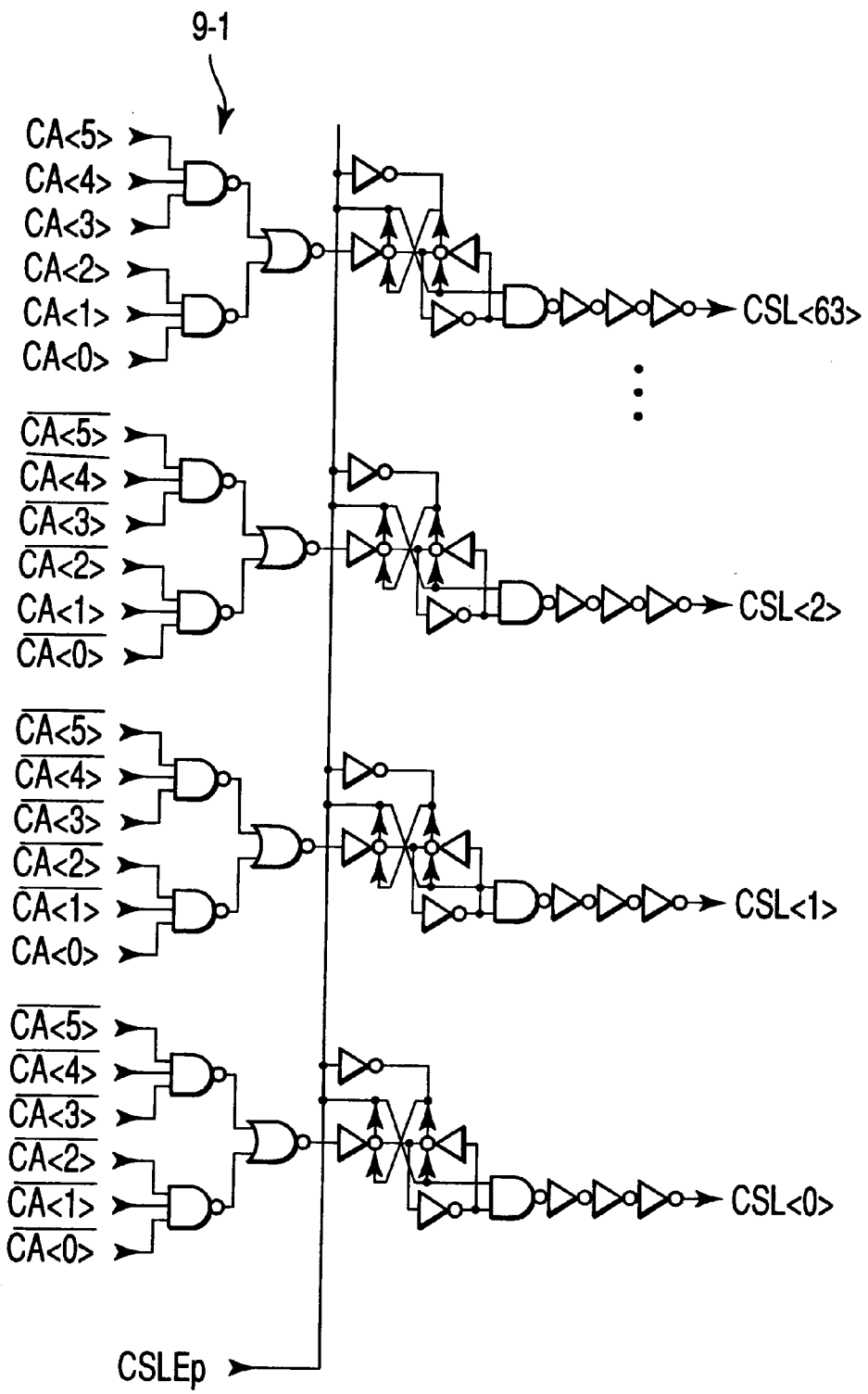
FIG. 4 is a schematic circuit diagram of CMOS type column selection circuits formed by using bulk elements.

FIG. 4 is a schematic circuit diagram of CMOS type column selection circuits formed by using bulk elements for the purpose of comparison with the column selection circuits of FIG. 3. Although the circuits of FIG. 4 are not described in detail, it will be appreciated that the number of elements and the number of stages in which the gates are arranged and connected of the column selection circuit 9-1 of FIG. 4 are much greater than those of the corresponding column selection circuit of FIG. 3 that is realized by using SOI elements.

As pointed out above, the sense amplifiers 3 and the column selection gates 4 are formed in the bulk region 1 of the above described first embodiment. As a result, the DRAM cells 2 and transfer gates of the column selection gates 4 show a good cutoff effect. Additionally, the sense amplifiers 3 show a good amplifying effect.

Still additionally, a plurality of word line selection circuits 7, a plurality of sense amplify control circuits 8, a plurality of column selection circuits 9, the data line access control circuit 10, a plurality of data latch circuits 11, a plurality of main data line drive circuits 12 and a plurality of sub-data latch circuits 13 are formed in the SOI region 6 so that they show a high current drivability, low power consumption rate and a high operation speed.

The DRAM macro is not entirely formed in the bulk region 1 of the above described embodiment in order to avoid that the size of the bulk region 1 varies as a function of the capacity of the DRAM and make it always show substantially the same size. Additionally, not only the DRAM cells but also the sense amplifiers 3 and the column selection gates 4 are formed in the bulk region in order to avoid that the bulk region 1 is divided into small parts to increase the area of the buffer region. The buffer region is an area having a width of several micrometers where neither SOI elements nor bulk elements are formed. Thus, there arise a problem that, as the size of the buffer region is increased, chip size will be increased.

Meanwhile, when a number of good bulk regions are formed in one chip, they need to be made substantially identical relative to each other in terms of size and shape. This will be described in greater detail below by referring to the second embodiment of the invention.

(2nd Embodiment)

Figure 5:
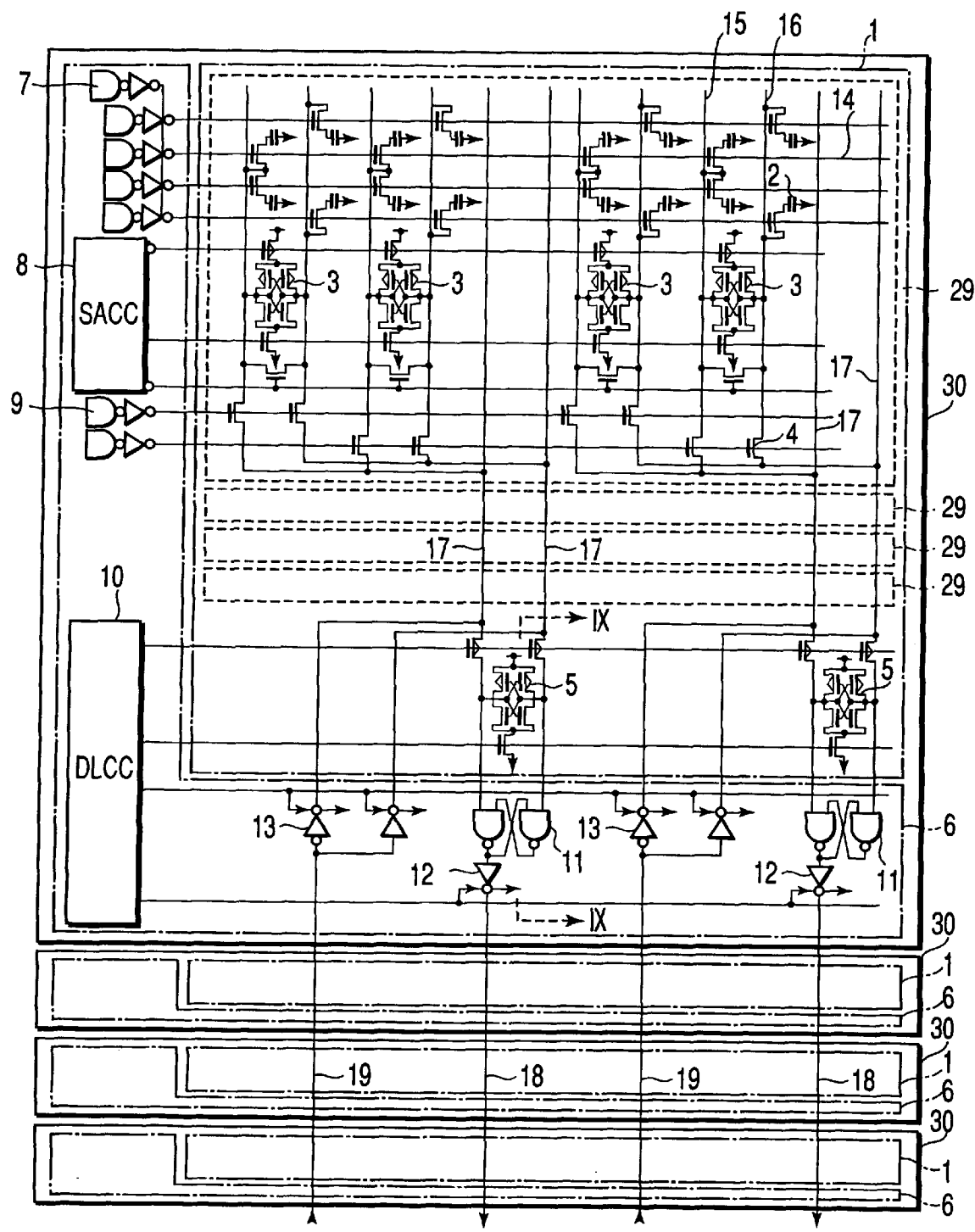
FIG. 5 is a schematic circuit diagram of the second embodiment of the invention.

FIG. 5 is a schematic circuit diagram of the second embodiment of the invention that is designed so as to be used for forming a large capacity DRAM macro.

Referring to 5, a total of four bulk regions 1 are formed in a semiconductor substrate for the second embodiment. Each bulk region 1 has a rectangular shape and typically contains four memory segments 29 in it. Each memory segment 29 in turn contains a plurality of DRAM cells 2, a plurality of sense amplifiers 3 and a plurality of column selection gates 4. The DRAM cells 2 are those of about 1 Mbit that are arranged in the form of a matrix to produce a memory cell array. The 1-Mbit memory segments are arranged in the direction of the bit lines 15, 16. On the other hand, pairs of data lines 17 are arranged in a wiring region located above the memory segments 29. For example, 128 pairs of sub-data line sense amplifiers 5 may be connected to the pairs of data lines 17.

On the other hand, an SOI region 6 is arranged adjacent to the bulk region 1. The SOI region 6 typically contains the word line selection circuit 7, the sense amplify control circuit 8, a plurality of column selection circuits 9, the data line access control circuit 10, a plurality of data latch circuits 11, a plurality of main data line drive circuits 12 and the sub-data line drive circuits 13.

A DRAM sub macro 30 of 4 Mbits is formed as memory region by the bulk region 1 containing four memory segments 29 and the SOI region 6. Then, a highly integrated 16-Mbit DRAM macro is formed by arranging four DRAM sub macros 30.

Figure 6:
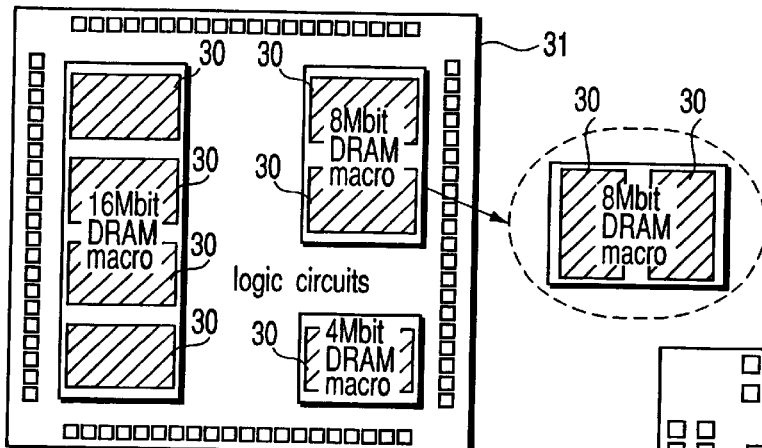
FIG. 6 is a schematic plan view of a system on chip realized by using DRAM sub macros as shown in FIG. 5.

FIG. 6 is a schematic illustration of a system on chip realized by using such DRAM sub macros 30. Referring to FIG. 6, a 16-Mbit DRAM macro realized by using four DRAM sub macros 30, an 8-Mbit DRAM macro realized by using two DRAM sub macros 30 and a 4-Mbit DRAM macro realized by using a single DRAM sub macro 30 are arranged on chip 31. Logic circuits are arranged to connect the DRAM macros.

The DRAM sub macros 30 of the 16-Mbit DRAM macro and the 8-Mbit DRAM macro are arranged in the direction of read-out main data lines 18 and write-in main data lines 19 (not shown). In FIG. 6, the DRAM sub macros 30 of the 16-Mbit DRAM macro are arranged in parallel with the DRAM sub macros 30 of the 8-Mbit DRAM macro. However, the arrangement of DRAM sub macros 30 is not limited to the illustrated one and the DRAM sub macros 30 of the 16-Mbit DRAM macro may alternatively be arranged in a direction perpendicular to the DRAM sub macros 30 of the 8-Mbit DRAM macro as shown in the circle of dotted line in FIG. 6. Then, the read-out main data lines 18 and the write-in main data lines 19 (not shown) of the 8-Mbit DRAM macro are running perpendicularly relative to the read-out main data lines 18 and the write-in main data lines 19 of the 16-Mbit DRAM macro (not shown).

Furthermore, the number of DRAM sub macros in each DRAM macro is not limited to the above described one. In other words, any number of DRAM sub macros may be used in each DRAM macro according to the specification of the chip. The number of DRAM sub macros may differ from DRAM macro to DRAM macro or may be same in all the DRAM macros.

In the case of a system on chip where DRAM macros with the same or different memory capacities are arranged on a single chip, again, the bulk regions of the DRAM sub macros 30 can be made to show substantially the same size.

Figure 7:
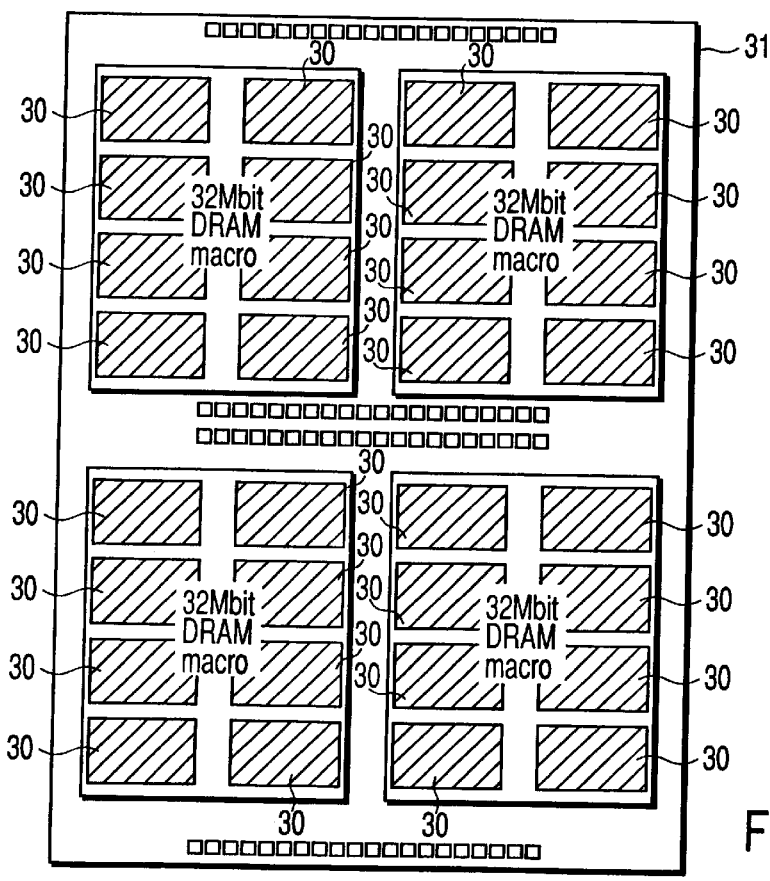
FIG. 7 is a schematic plan view of a cache memory realized by using DRAM sub macros as shown in FIG. 5.

FIG. 7 is a schematic illustration of a cache memory realized by using DRAM sub macros 30. The chip 31 of a cache memory that is required to have large capacity DRAM macros can be mostly occupied by bulk regions. However, according to the invention, SOI regions can be arranged appropriately in a chip by using DRAM sub macros 30. Then, such a cache memory can effectively utilize the advantages of SOI elements to operate at high speed.

Figure 8:
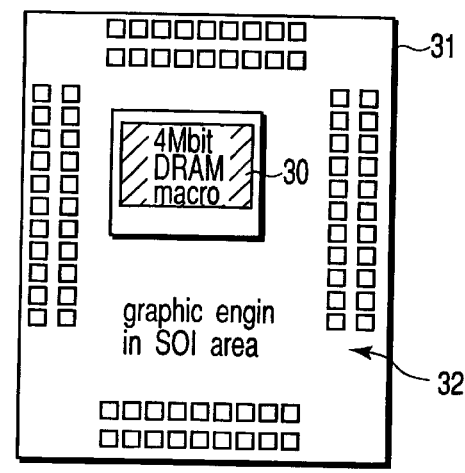
FIG. 8 is a schematic plan view of an LSI dedicated to image processing and realized by using DRAM sub macros as shown in FIG. 5.

FIG. 8 is a schematic plan view of an LSI dedicated to image processing and realized by using a DRAM sub macro 30 as shown in FIG. 5. Referring to FIG. 8, a DRAM sub macro 30 operating as a relatively small buffer memory of about 4 Mbits for storing an image and a high speed image processing logic circuit (graphic engine) 32 realized by using SOI elements are arranged on a single chip. Thus, the merged DRAM technology can be applied to such an LSI dedicated to image processing. A small bulk region is formed in part of the chip.

The memory capacities of the DRAM macros in the above described three applications differ greatly from each other. However, in any case, the bulk regions can be made to be substantially identical in terms of size and shape.

The areas and the sizes of the bulk regions 1 of the above described second embodiment are unified. When bulk regions having different shapes and areas are formed, the manufacturing process needs to be optimized for each bulk region, which consequently raise the manufacturing cost. On the other hand, the manufacturing cost can be minimized by using bulk regions 1 whose areas and shapes are unified.

Additionally, a uniform film quality can be realized for the bulk regions 1 that are epitaxial layers by unifying the shapes and areas thereof. Thus, the yield of manufacturing merged DRAM chips can be improved by using the partial SOI technology.

Figure 9:
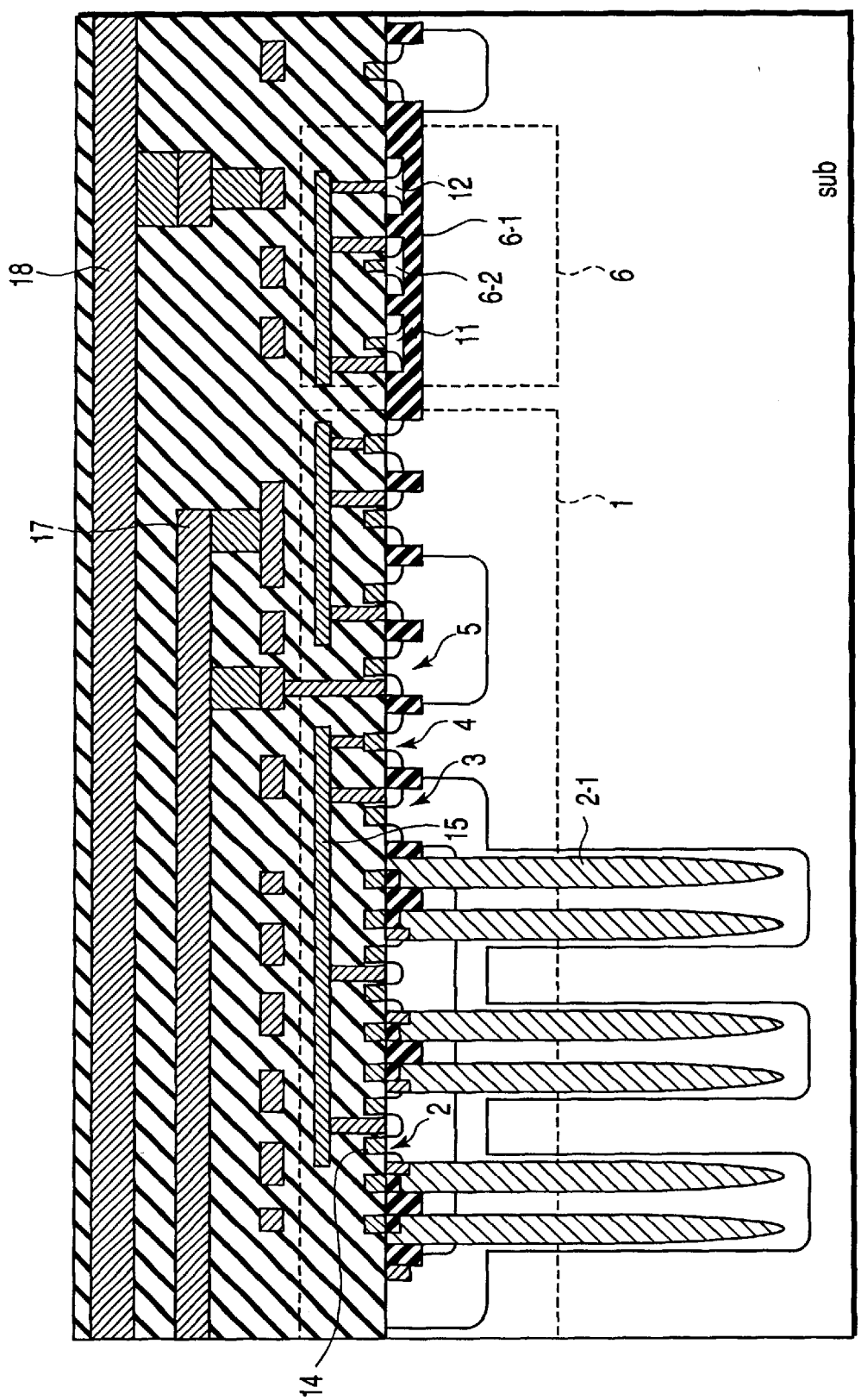
FIG. 9 is a schematic cross sectional view taken along line IX—IX in FIG. 5.

FIG. 9 is a schematic cross sectional view taken along line IX—IX in FIG. 5. In FIG. 9, the components the same as those of FIG. 5 are denoted respectively by the same reference symbols. For the purpose of simplification, the elements in FIG. 9 are schematized. Additionally, it should be noted the upper wiring layer on the semiconductor substrate is not completely identical with that of FIG. 5 because it is partly omitted for the purpose of simplicity.

Referring to FIG. 9, the semiconductor substrate (sub) is an SOI substrate where a buried insulating film is formed in advance. However, the present invention is by no means limited thereto. A bulk region 1 is formed on the SOI substrate by using the partial SOI technology. With the partial SOI technology, an opening is formed in the bulk forming region of the SOI substrate so as to make its bottom located below the buried insulating film and single crystal silicon is made to grow in the opening to close the latter and consequently produce a bulk region there.

Thus, a bulk region 1 and an SOI region 6 are formed in the SOI substrate. DRAM cells 2 having a trench type capacitor 2-1, sense amplifiers 3, column selection gates 4 and sub-data line sense amplifiers 5 are formed in the bulk region 1.

Data latch circuits 11 and main data line drive circuits 12 are formed in semiconductor layer 6-2 on the buried insulating film 6-1 that is formed in the substrate.

(3rd Embodiment)

Figure 10:
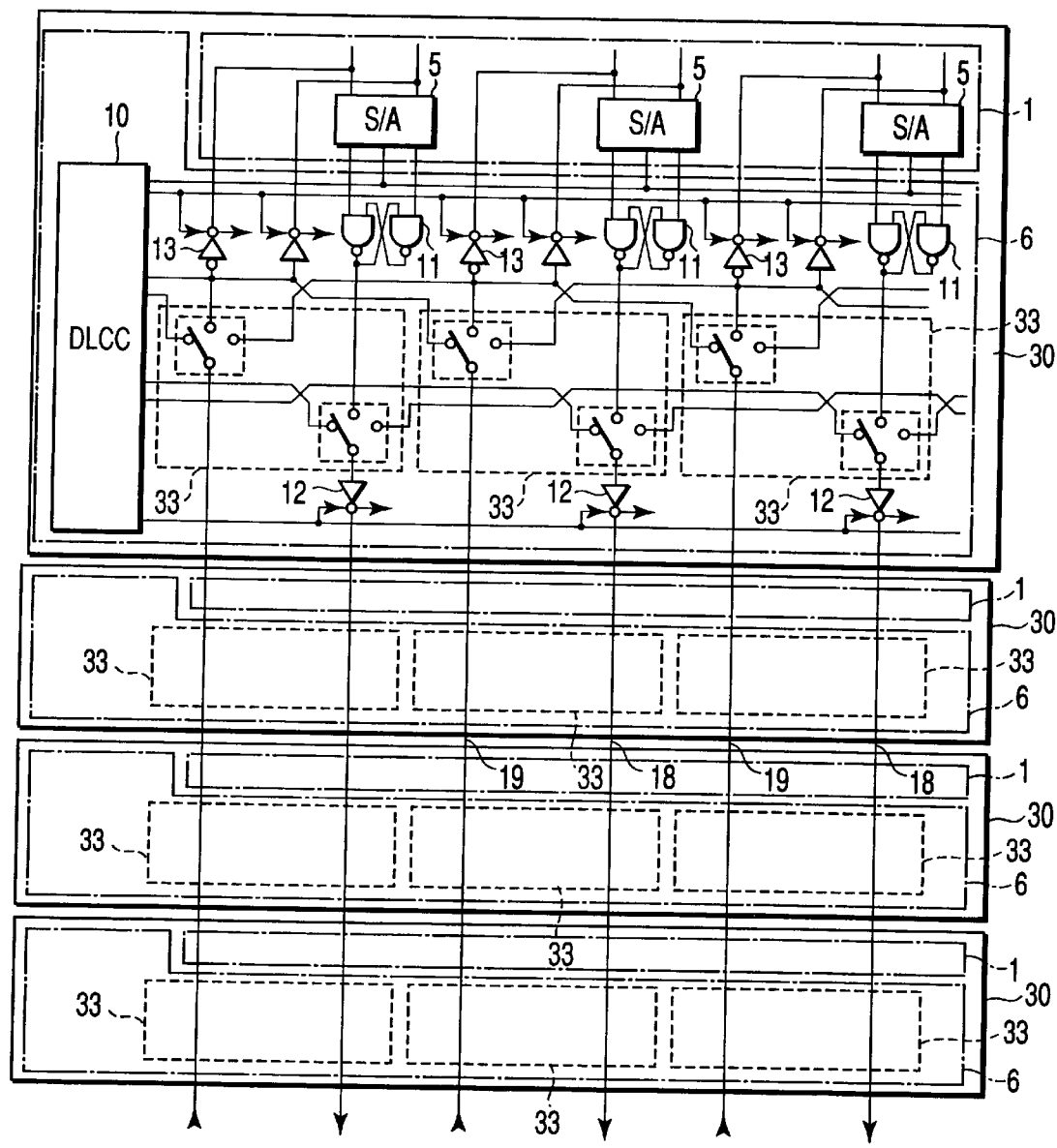
FIG. 10 is a schematic circuit diagram of the third embodiment of the invention.

FIG. 10 is a schematic circuit diagram of the third embodiment of the invention. With the third embodiment, it is possible to build a data path structure and manufacture a high speed operation semiconductor memory device at low cost by utilizing SOI elements.

In the third embodiment, DRAM cells 2 operating as memory cells, sense amplifiers 3, column selection gates 4 and sub-data line sense amplifiers 5 are formed in a bulk region 1 as in the case of the first and second embodiments. Therefore, only a bulk region 1 is schematically shown in FIG. 10 without illustrating any detailed circuit configuration.

On the other hand, a plurality of data latch circuit 11, a plurality of main data line drive circuits 12 and an plurality of sub-data line drive circuits 13 are arranged in an SOI region 6. Additionally, switch circuits 33 are also arranged there as defect relieving circuits. When there is a defective memory cell, a defective bit line or a defective sub-data line, the corresponding switch circuit 33 switches the defective sub-data line to a spare sub-data line and connects the spare sub-data line to the main data line. As the switch circuit 33 accesses a defective sub-data line in the circuit of FIG. 10, the latter is shifted either to the right side or the left side in FIG. 10 by the switch circuit 33. As a result, the defective sub-data line is disconnected from the corresponding main data line and the replacing sub-data line that operates normally is connected to the main data line.

Figure 11:
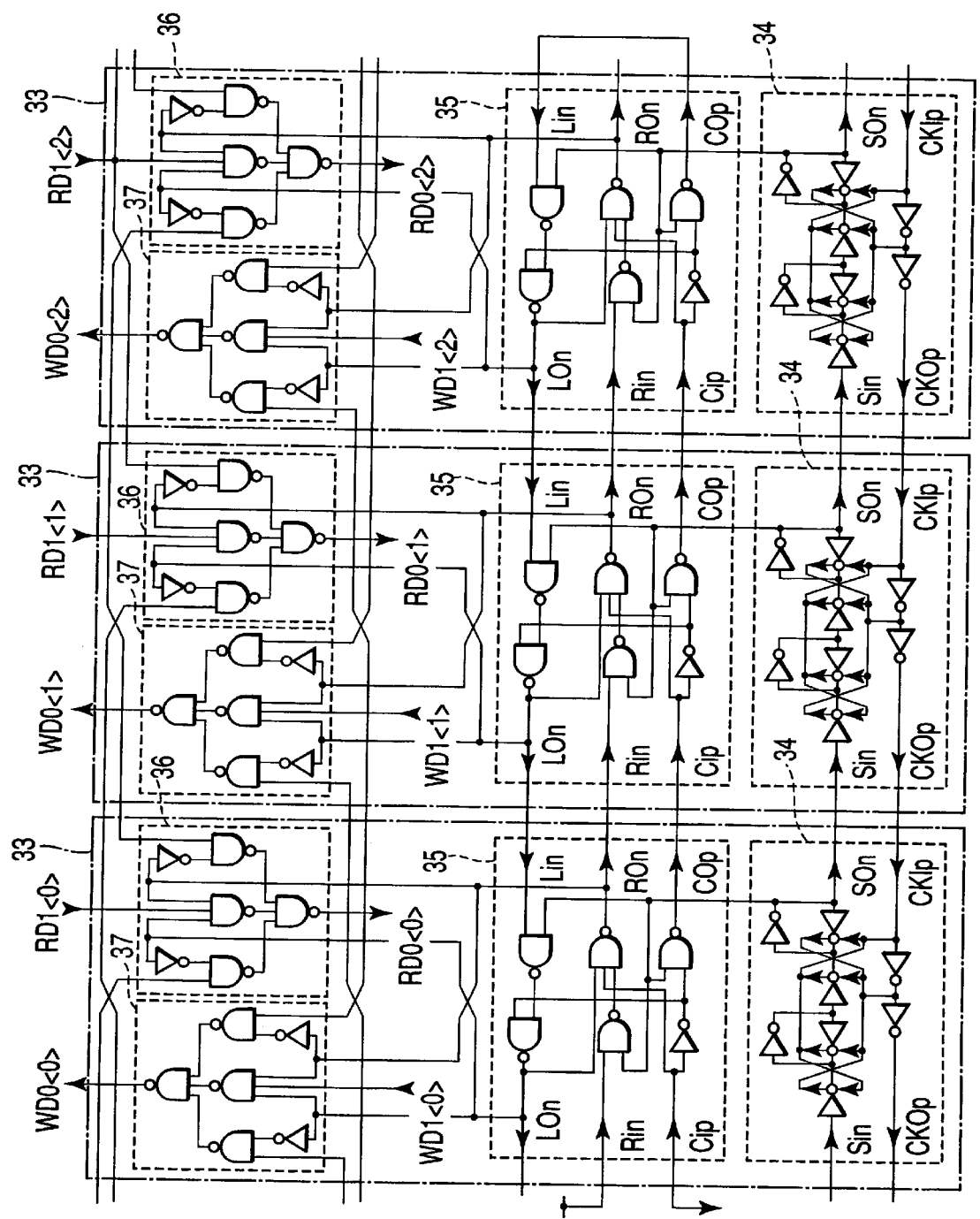
FIG. 11 is a schematic circuit diagram of a switch circuit that can be used for the third embodiment of FIG. 10.

FIG. 11 is a schematic circuit diagram of switch circuits 33 that can be used for the third embodiment of FIG. 10. As shown in FIG. 11, each switch circuit 33 comprises a 1-bit shift register 34, a carry control circuit 35, a read-out data line switch 36 and a write-in data line switch 37. The shift register 34 stores information that indicates that the corresponding sub-data line is defective. The output terminal of the shift register 34 is connected to the carry control circuit 35. The carry control circuit 35 performs a logic operation on the signal supplied from the adjacent switch circuit 33 and controls the read-out data line switch 36 and the write-in data line switch 37 according to the outcome of the logic operation.

Figure 12:
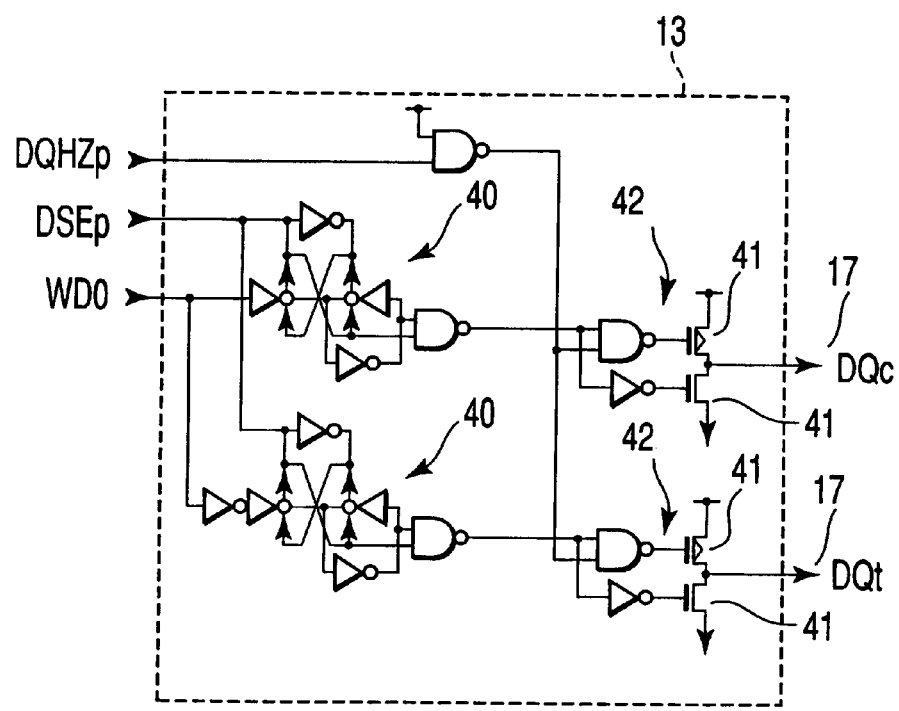
FIG. 12 is a schematic circuit diagram of sub-data line drive circuit that can be used for the embodiment of FIG. 10.

FIG. 12 is a schematic circuit diagram of sub-data line drive circuit 13 that can be used for the embodiment of FIG. 10. Output signal WDO of the write-in data line switch 37 shown in FIG. 11, clock signal DSEp for controlling the timing of write-in operation and clock signal DQHZp for controlling the timing of read-out operation are supplied to the data input terminal of the corresponding sub-data line drive circuit 13.

With the above described circuit configuration, input data latch circuit 40 takes in the output signal WDO of the write-in data line switch 37 as the clock signal DSEp is brought from the low potential level to the high potential level during a data writing operation. Then, in response, the drive circuit 42 is operated to bring one of the paired sub-data lines 17 down to the low potential level. Thereafter, the input data latch circuit 40 keeps the received signal as long as the clock signal DSEp is held to the high potential level. Subsequently, both of the paired sub-data lines 17 are precharged to the high potential level as the clock signal DSEp is brought down to the low potential level.

The paired sub-data lines 17 have a length of about 1 mm. As many as about 16 to 128 column selection gates (not shown) are connected to the sub-data lines 17. Therefore, the load capacity of the sub-data lines 17 are as large as about 0.5 pF. The transistors 41 for driving the respective sub-data lines 17 are required to show a high current drivability in order to fully charge and discharge the large load capacity.

SOI elements show a high current drivability if compared with bulk elements, due to the substrate floating effect. Therefore, the data paths can be made to operate at high speed and the overall layout dimensions can be reduced by using SOI elements for the sub-data line drive circuit 13. Note that the clock signal DQHZp is a signal that operates in the read-out operation and held to the low potential level in the write-in operation.

Figure 13:
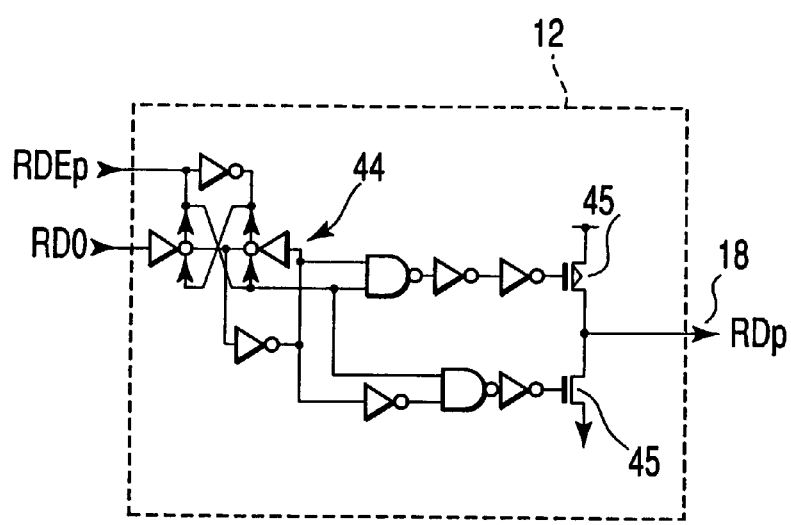
FIG. 13 is a main read-out data line drive circuit that can be used for the embodiment of FIG. 10.

FIG. 13 is a main read-out data line drive circuit 12 that can be used for the embodiment of FIG. 10. Output signal RDO of the read-out data line switch 36 and clock signal RDEp for controlling the timing of read-out operation are supplied to the data input terminal of the main read-out data line drive circuit 12.

As the signal RDEp is brought up to the high potential level from the low potential level in a readout operation, the read-out data latch circuit 44 latches the state of the data input terminal. At the same time, the main read-out data line drive transistor 45 drives the main read-out data line 18. Thereafter, the input data latch 44 maintains its state as long as the clock signal RDEp is held to the high potential level and the main read-out data line drive transistor 45 is brought into a high impedance state as the clock signal RDEp is brought to the low potential level.

The main read-out data line 18 has a length of about 4 mm. In the case of the embodiment of FIG. 10, four data line drive transistors arranged in the respective bulk regions are connected in series to the main read-out data line 18. Thus, the load capacity of the main readout data line 18 is as large as about 1 pF or more. The read-out data line drive transistors 45 shown in FIG. 13 are required to show a high current drivability in order to fully charge and discharge the large load capacity. SOI elements show a high current drivability if compared with bulk elements due to the substrate floating effect. Therefore, the data paths can be made to operate at high speed and the overall layout dimensions can be reduced by using SOI elements for the main read-out data line drive circuit 12.

As described above, the sub-data line drive circuits 13, the main read-out data line drive circuits 12 and the switch circuits 33 operating as defect relieving circuits of the data paths are formed by using SOI elements. The circuits constituting the data paths include a large number of transistors. Therefore, it is possible to exploit the advantages of SOI elements including small size and high drivability and manufacture high speed operating semiconductor devices at low cost by using SOI elements for the transistors.

Additionally, a high manufacturing yield can be achieved by providing switch circuits 33 as defect relieving circuits.

(4th Embodiment)

Figure 14:
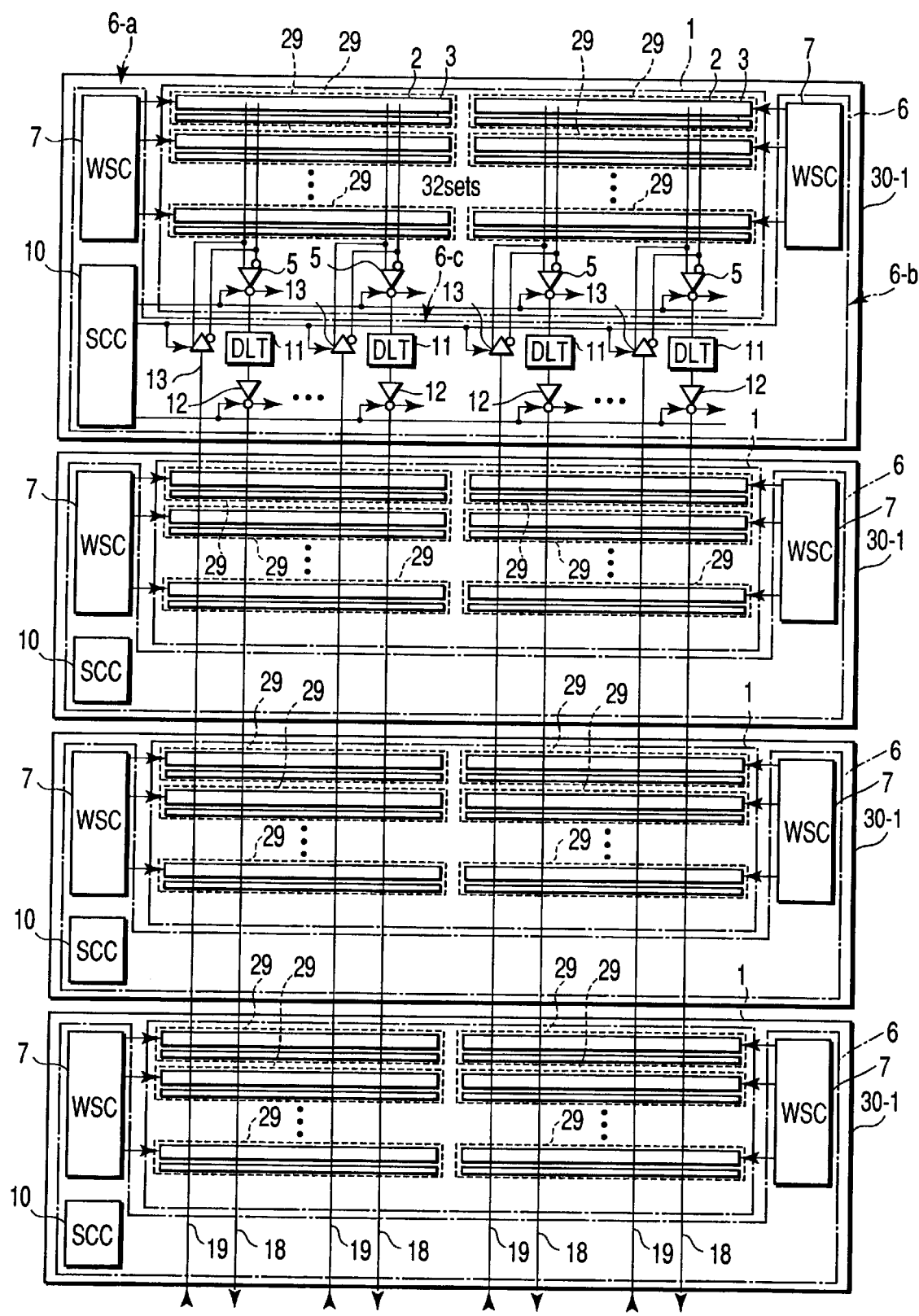
FIG. 14 is a schematic circuit diagram of the fourth embodiment of the invention.

FIG. 14 is a schematic circuit diagram of the fourth embodiment of the invention that can be used to form a high speed DRAM macro. Generally, short bit lines and word lines have to be used to suppress the parasitic capacity and the wiring resistance when forming a high speed DRAM macro. For this reason, the memory cells of high speed DRAM macros are divided into small groups if compared with ordinary DRAM macros having a comparable capacity.

Thus, if only DRAM cells are formed in bulk regions, the size of each bulk region is reduced as the memory cells are divided into smaller groups. Then, a large number of buffer regions need to be arranged between SOI regions and bulk regions respectively to raise the overall area of the buffer regions. The net result will be a large chip size and a high manufacturing cost.

In view of this problem, each 128K segment 29 is formed by using DRAM cells 2 of about 128 Kbits, about 1K sense amplifiers 3 and column selection gates 4 in the fourth embodiment.

Referring to FIG. 14, 32 128-Kbit segments 29 and 128 sub-data line sense amplifiers 5 are arranged in each bulk region 1 having a substantially rectangular shape. A SOI region 6 is arranged along three continuous sides of each bulk region 1. More specifically, the SOI region 6 has a first semiconductor region 6-*a* along one of a pair of parallel sides of the bulk region 1, a second semiconductor region 6-*b* along the other of the pair of parallel sides and a third semiconductor region b-c between the first and second semiconductor regions 6-*a*, 6-*b*.

Word line selection circuits (WSCs) 7, sense amplify control circuits 8, column selection circuits 9 and sub-data line sense control circuits (SSCs) 10 are arranged in the first semiconductor region 6-*a*. Note that only the word line selection circuits (WSCs) 7 and the sub-data line sense control circuits (SSCs) 10 are shown in FIG. 14. Similarly, word line selection circuits (WSCs) 7, sense amplify control circuits 8 and column selection circuits 9 are arranged in the second semiconductor region 6-*b*, although only the word line selection circuits (WSCs) 7 are shown in FIG. 14. Data latch circuits (DLTs) 11, main data line drive circuits 12 and sub-data line drive circuits 13 are arranged in the third semiconductor region 6-*c*.

A 4-Mbit DRAM sub macro 30-1 is formed by using a bulk region 1 and an SOI region 6. A high speed DRAM macro having a desired large capacity is realized by arranging the necessary number of 4-Mbit DRAM sub macros 30-1.

With the above described fourth embodiment, the bit lines and the word lines are kept short to suppress the parasitic capacity and the wiring resistance by dividing the memory segments 29 of each bulk region 1 into small parts. Additionally, word line selection circuits 7 and other circuits are arranged in the first and second semiconductor regions 6-*a*, 6-*b* of each SOI region 6 that is formed along three of the four sides of the corresponding bulk region 1. With this arrangement, it is possible to realize a high speed DRAM macro.

A 16-Mbit high speed DRAM macro formed by using the fourth embodiment shows a surface area greater than that of the 16-Mbit DRAM macro of the second embodiment. However, the DRAM macro of the fourth embodiment can operate at a speed higher than the DRAM macro of the second embodiment. Therefore, the performance and the cost of a DRAM macro can be optimized by selecting an optimal configuration for the DRAM macro depending on the application thereof. Meanwhile, there may be occasions where two DRAM macros with different characteristics have to be mounted on one chip.

Figure 15:
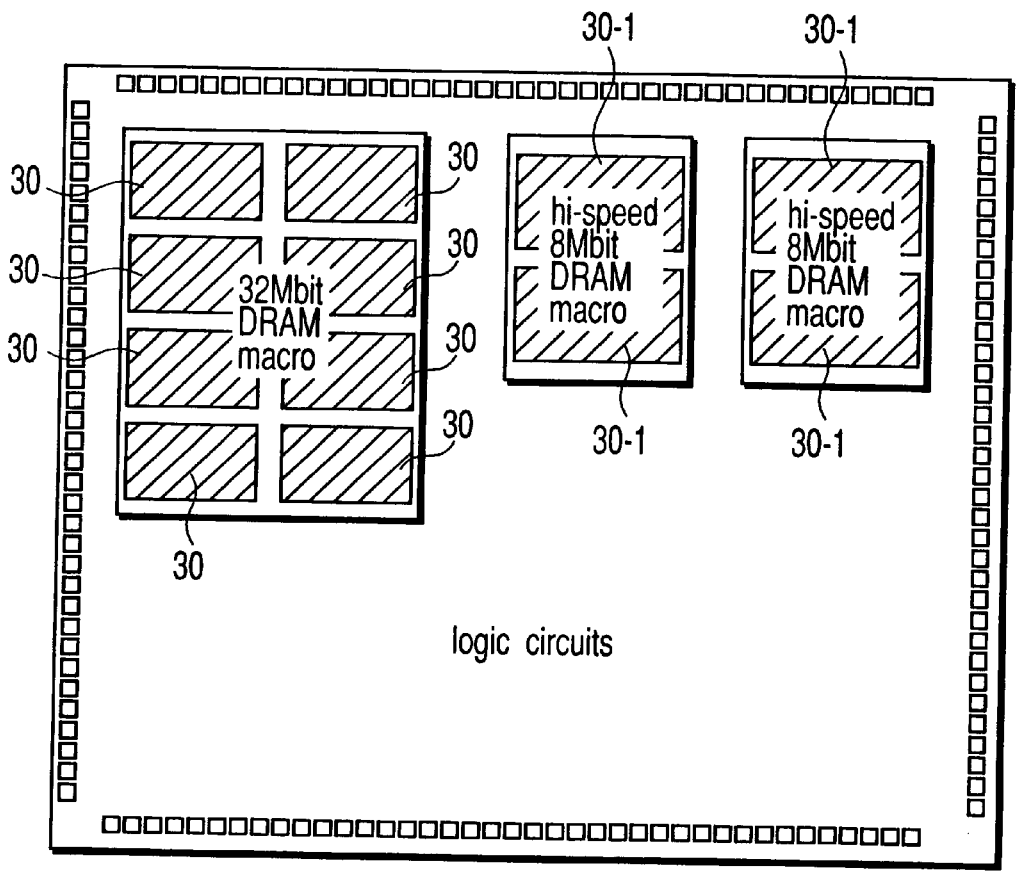
FIG. 15 is a schematic plan view of a chip formed by using DRAM sub macros of the fourth embodiment and those of the second embodiment.

FIG. 15 shows an arrangement where a 32-Mbit highly integrated DRAM macro is formed by using DRAM sub macros 30 of the second embodiment and two high speed operating 8-Mbit DRAM macros formed by using DRAM sub macros 30-1 of the fourth embodiment.

With such an arrangement again, the bulk regions can be made to show substantially the same area. In other words, the partial SOI technology can be used reliably for such an arrangement so that it is possible to manufacture a high speed operating system LSI at low cost.

(5th Embodiment)

FIG. 16 is a schematic circuit diagram of the fifth embodiment of the invention, which is a low voltage semiconductor memory device showing a low power consumption rate and realized by utilizing the partial SOI technology.

The bulk region 1 illustrated in FIG. 16 has a configuration substantially the same as that of FIG. 5. More specifically, a total of four memory segments 29 are formed in each bulk region 1. Each memory segment 29 contains DRAM cells 2 forming a memory cell array, word lines 14, bit lines 15, 16, sense amplifiers 3, column selection gates 4 and sub-data line sense amplifiers 5 connected to the corresponding DRAM cells 2.

On the other hand, each SOI region 6 contains word line selection circuits (WSCs) 7, sense amplifier control circuits (SACCs) 8, column selection circuits (CSCs) 9, data line access control circuits (DLCCs) 10, data latch circuits (DLTs) 11, main data line drive circuits 12 and sub-data line drive circuits 13.

Additionally, the last step drivers 46 of a step-down circuit 47, which will be described hereinafter, are arranged in the SOI region 6. Each of the last step drivers 46 typically comprises an NMOS transistor and operates as a step-down power source VAA that steps down the supply voltage VDD. The step-down power source VAA operates as a power source for the corresponding sense amplify 3.

Of the plurality of bulk regions 1, the bulk region 1 located at the top in FIG. 16 has an extended bulk region 49, which contains a step-down control circuit 48. The last-step drivers 46 are controlled by the output voltage of the step-down control circuit 48.

Figure 17:
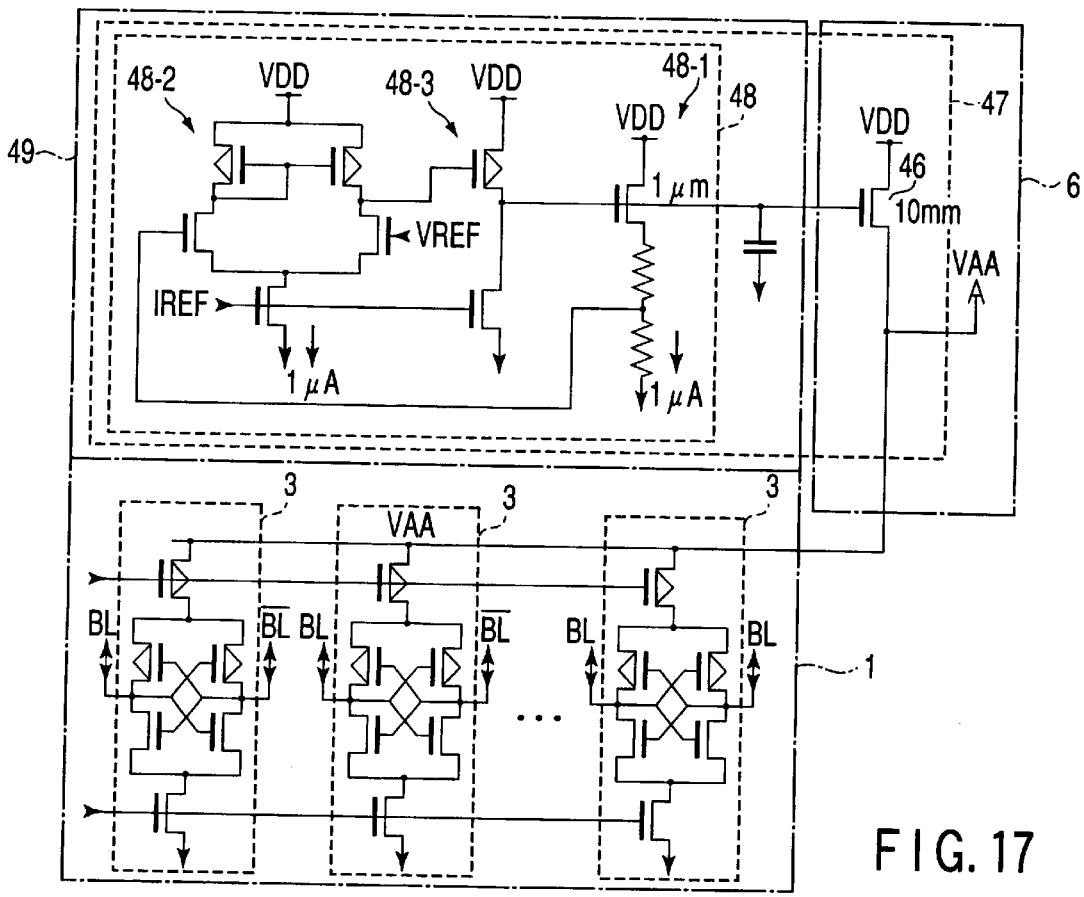
FIG. 17 is a schematic circuit diagram of a step-down circuit that can be used for the fifth embodiment of FIG. 16.

FIG. 17 is a schematic circuit diagram of a step-down circuit 47 that can be used for the fifth embodiment of FIG. 16. In FIG. 17, only one last step driver in the last step drivers is drawn. As pointed out above, the step-down circuit 47 is formed by a step-down control circuit 48 and the last step driver 46 and the output terminal of the last step driver 46 is connected to the power supply terminals of the sense amplifiers 3. The step-down control circuit 48 comprises a detecting section 48-1, a comparator 48-2 and a voltage generating section 48-3. The detecting section 48-1 detects the gate voltage applied to the gate electrode of the last step driver 46. The comparator 48-2 compares the gate voltage detected by the detecting section 48-1 and reference voltage VREF. The voltage generating section 48-3 generates a gate voltage according to the output signal of the comparator 48-2. The generated gate voltage is applied to the gate electrode of the last step driver 46.

What is characteristic here is that the step-down control circuit 48 and the sense amplifiers 3 are formed by using bulk elements so as to do analog operations and only the last step driver 46 is formed by using an SOI element.

The NMOS transistor of the last step driver 46 operates in a biased condition of the source follower. The NMOS transistor is a huge transistor whose overall channel width is as huge as 20 mm so as to make it operate in a sub-threshold region.

Figure 18:
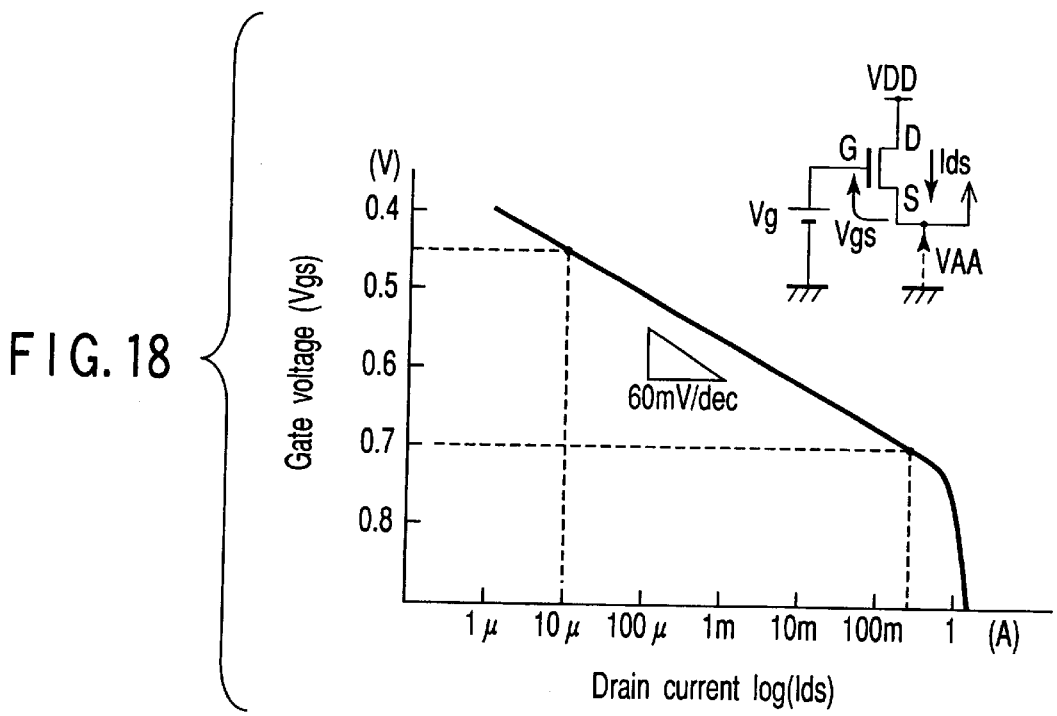
FIG. 18 is a graph illustrating the performance of the last step drivers of the step-down circuit of FIG. 17.

FIG. 18 is a graph illustrating the Vgs-Ids relationship of the above NMOS transistor. Normally, the Vg-Id characteristic of an NMOS transistor is expressed by a graph where the horizontal axis represents the gate voltage (Vgs) and the vertical axis represents the drain current (Ids). Note, however, in the graph of FIG. 18, the vertical axis represents the negative gate voltage (−Vgs) and the horizontal axis represents the drain current as expressed in logarithmic terms (log (Ids)).

The static characteristics of the NMOS transistor can be expressed in terms of the load characteristics of the step-down circuit 74. Then, the horizontal axis represents the load current of the step-down power source and the vertical axis represents the output voltage under the given conditions. Therefore, if the gate voltage of the NMOS transistor is Vg, the step-down voltage VAA is expressed by the formula below.

$$VAA = Vg - Vgs$$

A plurality of sense amplifiers 3 operate simultaneously in a write/read operation of a DRAM. Therefore, the write/read current shows a large peak value. When a total of 2K bit line pairs having a parasitic capacity of 100 fF are driven to 1V in a period of 1 ns, a peak current of 200 mA will be required. Even when such a load current flows, the last step driver. 46 having an overall channel width of 20 mm of the circuit shown in FIG. 17 can be regarded to be operating in a sub-threshold characteristic region. Therefore, when the gate voltage Vg is held to a constant level, the output voltage VAA (200 mA) of the last step driver 46 for the current of 200 mA is expressed by the formula below.

$$VAA(200\ mA) = Vg - 0.7V$$

On the other hand, when the sense amplifiers 3 are not operating or the bit lines are held to a full amplitude so as to remain in a stable state, the load current becomes as small as 10 μA which is practically equal to nil. From FIG. 18, it will be seen that the output voltage in this state is expressed by the formula below.

$$VAA(10\ \mu A) = Vg - 0.45V$$

A step-down circuit 47 having a source follower type last step driver 46 as shown in FIG. 18 provides an advantage in allowing the load current to vary over a wide range. On the other hand, however, it is accompanied by a disadvantage that the output voltage can change depending on the load current because the step down control circuit 48 does not refer to the output voltage of the last step driver 46. The variance of the output voltage depends on the sub-threshold characteristics of the last step driver 46.

The sub-threshold performance of an SOI element is expressed by 60 mV/dec which is smaller than the corresponding value of 100 mV/dec of a bulk element. Therefore, the use of an SOI element for the last step driver 46 is advantageous for forming a step down circuit adapted to a semiconductor memory device.

In the above described fifth embodiment, the step down control circuit 48 of the step down circuit 74 is arranged in the bulk region 1, while the last step driver 46 is arranged in the SOI region 6. Differently stated, the last step driver 46 is formed in the SOI region that separates the two adjacent bulk regions 1. Additionally, the last step driver 46b is arranged in a distributed way so as to be located near a circuit that needs a stepped down voltage, such as a sense amplifier 3. As a result, the voltage fall of the supply potential that can be produced by the parasitic resistance of the power supply line from the last step driver 46 to the sense amplify 3 can be minimized.

Furthermore, a single potential control circuit 48 is arranged in the extended bulk region 49 shown at the top in FIG. 16. Generally, a semiconductor memory device requires a power supply control circuit that does analog operations. The area occupied by the circuit is very small relative to the area of the memory cell array. Therefore, a bulk region necessary for analog circuits can be secured by extending the bulk region 1 into a top area in FIG. 16 to such a small extent that the stability of the partial SOI process may not be damaged by it.

(6th Embodiment)

Now, the sixth embodiment of the present invention will be described below. Semiconductor devices require various internal pulse signals for them to be driven to operate. Such internal pulses are generated by a pulse generator according to a clock signal CLK. A pulse generator generally comprises a CR delay circuit typically formed by arranging a capacitor C and a resistor R and a logic circuit to which the output signal of the CR delay circuit is supplied. Such a pulse generator is so required that the pulse signal it generates does not change as a function of the supply voltage and it has operating characteristics that make it possible to generate an accurate internal pulse signal from a clock signal CLK that is made to show a high frequency.

FIG. 19 is a schematic block diagram of the sixth embodiment. In FIG. 19, the components same as or similar to those of the embodiment shown in FIGS. 1 and 3 are denoted respectively by the same reference symbols. FIG. 19 shows a pulse generator 51 typically adapted to generate a column selection timing signal CSLEp as illustrated in FIG. 3. The pulse generator 51 is formed in SOI region 6 along with a word line selection circuit 7, a column selection circuit 9, a row decoder 52 and a column decoder 53. Memory segment 29, a plurality of sense amplifiers 3 and a plurality of column selection gates 4 are formed in bulk region 1.

The pulse generator 51 generates a column selection timing signal CSLEp according to a clock signal CLK. The column selection timing signal CSLEp is supplied to the column selection circuit 9 with the output signal of the column decoder 53. The column selection signals CSL (0) through CSL (n-1) output from the column selection signal 9 are supplied to the plurality of column selection gates 4. The data read out from the memory segment 29 can be subjected to burst transfer as a narrow and highly accurate pulse signal is output from the pulse generator 51 and the column selection signals CSL (0) through CSL (n-1) are sequentially output in response to the output signal of the column decoder. Note that the detailed circuit diagrams of the row-related circuits are omitted in FIG. 19.

Figure 20:
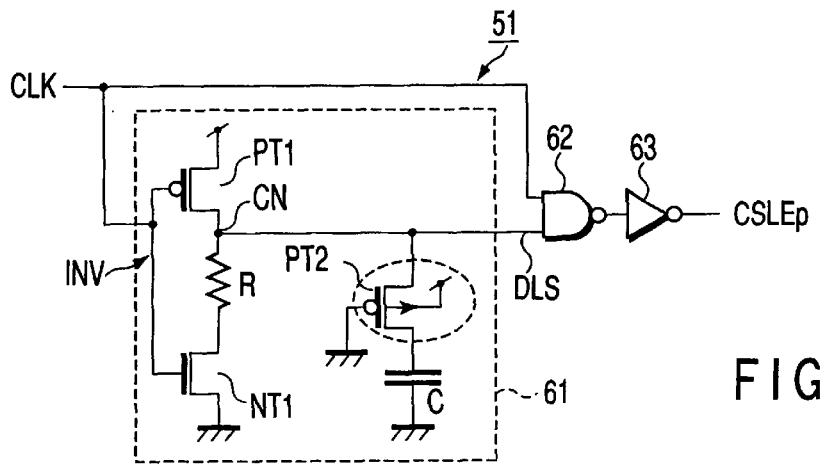
FIG. 20 is a schematic circuit diagram of the pulse generator of the embodiment of FIG. 19.

FIG. 20 is a schematic circuit diagram of the pulse generator 51 of the embodiment.

The pulse generator 51 illustrated in FIG. 20 comprises a delay circuit 61 to which clock signals CLK is supplied, a NAND circuit 62 and an inverter circuit 63. The clock signal CLK is supplied to the first input terminal of the NAND circuit 62 and also to the delay circuit 61. The delay signal DLS output from the delay circuit 61 is supplied to the second input terminal of the NAND circuit 62. The output terminal of the NAND circuit 62 is connected to the input terminal of the inverter circuit 63. Column selection timing signal CSLEp is output from the output terminal of the inverter circuit 63. Note that, in the following description, column selection timing signal CSLEp is simply referred to as pulse signal CSLEp.

The delay circuit 61 comprises P-channel MOS transistors PT1, PT2, a resistor R, an N-channel MOS transistor NT1 and a capacitor C. The transistor PT1, the resistor R and the transistor NT1 are connected in series between the power source and the ground to constitute an inverter circuit INV. Clock signal CLK is supplied to the gates of the transistors PT1, NT1. The connection node CN, connecting the transistor PT1 with the resistor R, operating as output terminal of the delay circuit 61 is connected to the second input terminal of the NAND circuit 62. The transistor PT2 and the capacitor C are connected in series between the connection node CN and the ground. The gate of the transistor PT2 is grounded and power is supplied from the power source to the substrate.

Figure 21:
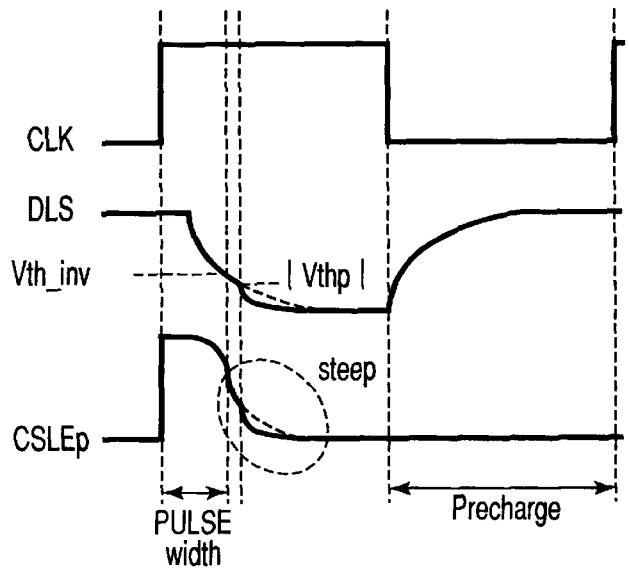
FIG. 21 is a graph of waveforms illustrating the operation of the circuit of FIG. 20.

Now, the operation of the above pulse generator 51 will be described below by referring to FIG. 21.

When the clock signal CLK is at level LOW, the low level signal is input to the inverter circuit INV in the delay circuit 61 to bring the transistor PT1 and the transistor NT1 respectively to ON state and OFF state. As a result, the capacitor C is charged by way of the transistor PT1 and the transistor PT2. At this time, the first input terminal of the NAND circuit 62 is at level LOW, while the second input terminal of the NAND circuit 62 is at level HIGH. Thus, the output signal of the NAND circuit 62 is at level HIGH and the pulse signal CSLEp output from the inverter circuit 63 is at level LOW.

Thereafter, as the clock signal CLK is brought up to level HIGH, the output signal of the NAND circuit 62 is brought down to level LOW and the pulse signal CSLEpi is brought up to level HIGH.

As the clock signal CLK is brought up to level HIGH, a high level signal is supplied to the inverter circuit in the delay circuit 61. Thus, the transistor PT1 is brought to OFF state while the transistor NT1 is brought to ON state so that the capacitor C starts discharging. In the initial stages of the electric discharge, the delay signal DLS remains at level HIGH. Therefore, the transistor PT2 is at ON state in its linear region of operation. Subsequently, as the electric discharge of the capacitor C proceeds, the electric potential of the delay signal DLS falls and eventually the delay signal DLS is judged to be at level LOW by the NAND circuit 62. As the electric potential of the delay signal DLS falls below the threshold voltage $Vth\_inv$ so that the delay signal DLS is judged to be at level LOW by the inverter circuit 63, the pulse signal CSLEp is brought down to level LOW.

As the electric potential of the delay signal DLS falls further to get to the absolute value of $|Vthp|$ ($<Vth\_inv$) of the threshold voltage of the transistor PT2, the transistor PT2 is brought to OFF state. As the transistor PT2 is brought to OFF state, the capacitor C is isolated from the connection node CN. As a result, the potential of the connection node CN is made to rapidly approach the ground potential by the inverter circuit INV. In other words, as the potential of the delay signal DLS is brought down below the threshold voltage $Vth\_inv$ of the inverter circuit INV, the edge of the pulse signal CSLEp becomes sharper (as indicated by a solid line in the area surrounded by a broken line in FIG. 21).

The operation of the logic circuit formed by the NAND circuit 62 and the inverter circuit 63 depends on the supply voltage to a large extent. The pulse width of the pulse signal CSLEp can be defined more accurately when the delay signal DLS input to the logic circuit has a sharp edge (as indicated by solid lines in FIG. 21) than when the delay signal DLS has a mild edge (as indicated by a broken line in FIG. 21). In other words, the supply voltage dependency of the pulse width can be reduced.

With the sixth embodiment, the capacitor C is connected between the connection node CN of the inverter circuit INV of the delay circuit 61 and the ground by way of the P-channel MOS transistor PT2 whose gate electrode is grounded. Therefore, when electricity is discharged from the capacitor C, the transistor PT2 is turned off as the electric potential of the delay signal DLS falls below the threshold voltage of the transistor PT2 and the capacitor C is isolated from the connection node CN. As a result, the electric potential of the delay signal DLS can be made to fall quickly by the inverter circuit INV. Thus, the lower end of the pulse signal CSLEp can be made to show a sharp edge by reducing the influence of the logic circuit that is formed by the NAND circuit 62 and the inverter circuit 63 and shows supply voltage dependency.

Additionally, the pulse generator 51 can rapidly lower the level of the delay signal DLS. Therefore, its response characteristics can be prevented from being degraded to make it possible to operate at high speed when the frequency of the clock signal CLK is raised.

Furthermore, since the pulse generator 51 is formed in the SOI region 6, it can operate at high speed to show a high current drive capability and a low power consumption rate.

(7th Embodiment)

Figure 22:
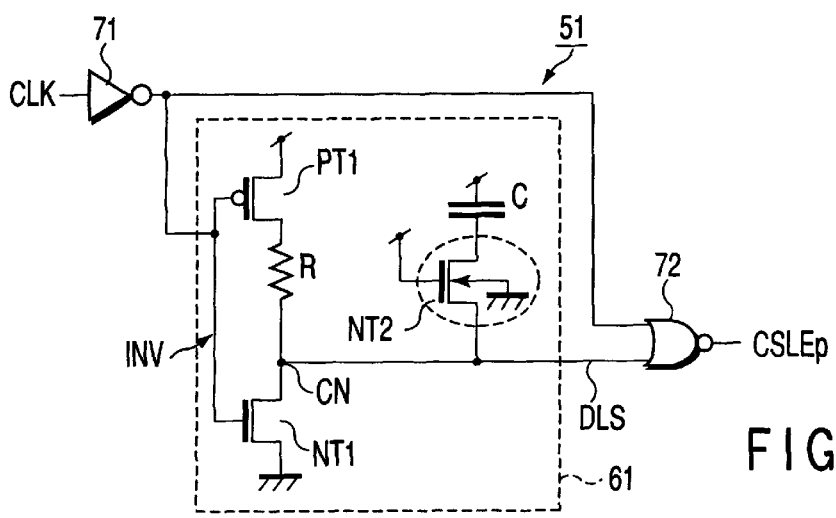
FIG. 22 is a schematic circuit diagram of the pulse generator of the seventh embodiment of the invention.
Figure 23:
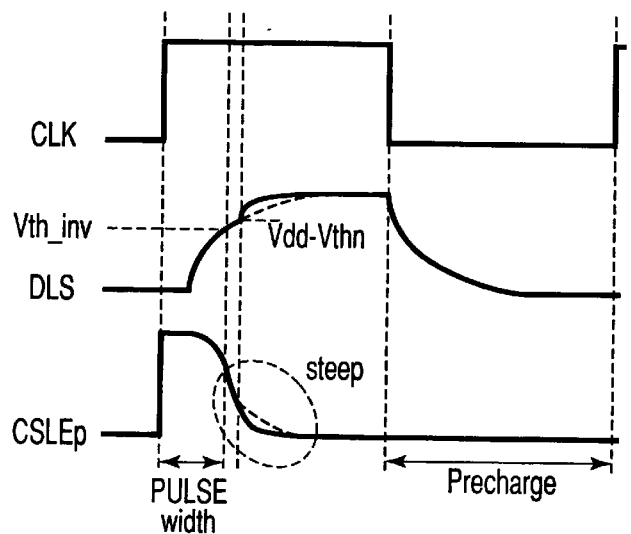
FIG. 23 is a graph of waveforms illustrating the operation of the circuit of FIG. 22.

FIGS. 22 and 23 schematically illustrate the seventh embodiment of the invention. In FIGS. 22 and 23, the components same as or similar to those of the sixth embodiment are denoted respectively by the same reference symbols.

In the pulse generator 51 of FIG. 20, the capacitor C is charged to show a potential equal to the supply voltage. Different from the sixth embodiment, the capacitor C of the pulse generator 51 of this embodiment is made to show a charged potential that is equal to the ground potential.

Referring to FIG. 22, clock signal CLK is supplied to the first input terminal of NOR circuit 72 and delay circuit 61 by way of inverter circuit 71. The delay signal DLS output from the delay circuit 61 is supplied to the second input terminal of the NOR circuit 72.

In said delay circuit 61, N-channel MOS transistor NT2 and capacitor C are connected between the connection node CN of resistor R and transistor NT1 and the power source. The supply voltage is applied to the gate electrode of the transistor NT2 and the substrate is grounded.

As shown in FIG. 23, the capacitor C of the pulse generator 51 is charged to the ground potential when the clock signal CLK is at level LOW. The pulse generator 51 operates substantially same as its counterpart of the sixth embodiment. When the clock signal CLK is brought to level HIGH, the transistor PT1 is turned on and the capacitor C starts discharging. Immediately after the start of the discharge, the transistor NT2 is at ON state in its linear region of operation. The transistor NT2 is brought to OFF state when the potential of the delay signal DLS rises to the level of Vdd-Vthn that is higher than the threshold voltage Vth_inv at which it is judged to be at level HIGH by the NOR circuit 72. Note that Vdd is the supply voltage and Vthn is the threshold voltage of the transistor NT2. As the transistor NT2 is brought to OFF state, the potential of the delay signal DLS rises sharply. As a result, the lower end of the pulse signal CSLEp is made to show a sharp edge.

The seventh embodiment provides advantages similar to those of the sixth embodiment.

(8th Embodiment)

Figure 24:
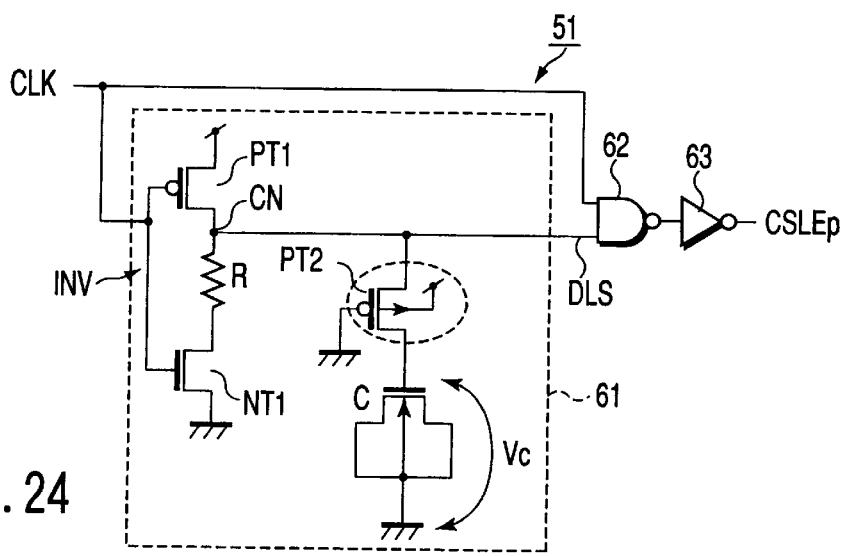
FIG. 24 is a schematic circuit diagram of the pulse generator of the eighth embodiment of the invention.

FIG. 24 schematically illustrates the eighth embodiment of the invention. In FIG. 24, the components same as or similar to those of FIG. 20 are denoted respectively by the same reference symbols. This embodiment will be described only in terms of the difference between this embodiment and that of FIG. 20.

Referring to FIG. 24, the capacitor C is formed by using a MOS capacitor that utilizes an N-channel MOS transistor. The capacitance of a MOS capacitor that utilizes an N-channel MOS transistor maintains a constant level so long as a voltage not lower than the threshold voltage Vthn of an nMOS transistor is applied to its gate electrode. However, the capacitance is reduced rapidly when the voltage being applied to the gate electrode falls under the threshold voltage Vthn. A MOS capacitor that utilizes an N-channel MOS transistor shows such power source dependency. It will be appreciated that only an operating zone where the capacitance is held to a constant level can be selectively used by making the timing of turning off the P-channel MOS transistor PT2 come earlier than the timing at which the capacitance of the MOS capacitor begins to be reduced rapidly. Such a timing can be selected by defining the relationship between the threshold voltage of the P-channel MOS transistor PT2 and that of the MOS capacitor to be |Vthp|>Vthn. The timing of turning off the P-channel MOS transistor PT2 can be made to come earlier than the timing at which the capacitance of the MOS capacitor begins to be reduced rapidly by defining the relationship of the threshold voltages in this way.

Since the pulse generator 51 of FIG. 24 operates substantially same as its counterpart of the sixth embodiment of FIG. 20, it will not be described here any further.

The above described eighth embodiment provides advantages same as those of the sixth embodiment. Furthermore, it provides an additional advantage that the number of steps for manufacturing the capacitor can be reduced by using a MOS capacitor.

(9th Embodiment)

Figure 25:
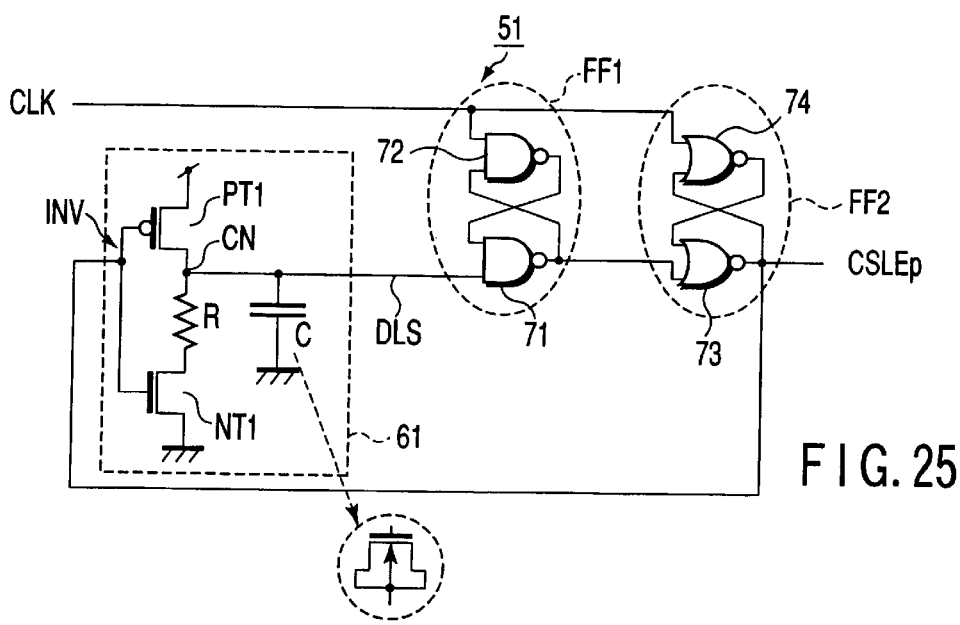
FIG. 25 is a schematic circuit diagram of the pulse generator of the ninth embodiment of the invention.

FIG. 25 schematically illustrates the ninth embodiment. In FIG. 25, the components same as or similar to those of the sixth embodiment are denoted respectively by the same reference symbols.

In the pulse generator 51 of FIG. 25, clock signal CLK is supplied to the first input terminals of first and second flip-flop circuits FF1, FF2. The first flip-flop circuit FF1 is formed by using NAND circuits 71, 72, whereas the second flip-flop circuit FF2 is formed by using NOR circuits 73, 74. The second input terminal of the first flip-flop circuit FF1 is connected to the connection node CN that operates as the output terminal of the delay circuit 61. The output terminal of the first flip-flop circuit FF1 is connected to the second input terminal of the second flip-flop circuit FF2. The output terminal of the second flip-flop circuit FF2 is connected to the input terminal of the delay circuit 61. In the delay circuit 61, a capacitor C is connected between the connection node CN and the ground.

In the pulse generator 51 of FIG. 25, the capacitor C is charged by utilizing pulse signal CSLEp output from the second flip-flop circuit FF2. More specifically, in the second flip-flop circuit FF2, the output signal of the NOR circuit 73 that operates as output node showing a polarity opposite to that of the clock signal CLK is supplied to the delay circuit 61. The first flip-flop circuit FF1 connected between the delay circuit 61 and the second flip-flop circuit FF2 operates to prevent oscillation of the output pulse signal due to negative feedback form occurring.

The operation of the pulse generator 51 will be described below by referring to FIG. 26A. When the clock signal CLK is at level LOW, the output signal of the NAND circuit 72 is at level HIGH without fail. Therefore, the NAND circuit 71 operates as an inverter circuit that outputs an inverse signal of delay signal DLS. Similarly, the NOR circuit 74 operates as an inverter circuit that outputs an inverse signal of pulse signal CSLEp. Under this condition, inverted pulse signal CSLEp from the NOR circuit 74 is supplied to one of the two input terminals of the NOR circuit 73 while the pulse signal CSLEp that has passed through the inverter circuit INV in the delay circuit 61 and the NAND circuit 71 is supplied directly to the other input terminal. Since signals that are inverted relative to each other are supplied respectively to the two input terminals of the NOR circuit 73, the pulse signal CSLEp output from the NOR circuit 73 is initialized to be at level LOW. At this time, the capacitor C in the delay circuit 61 is charged and the delay signal DLS is brought up to level HIGH.

Thereafter, as the clock signal CLK is brought up to level HIGH, the first flip-flop circuit FF1 holds the output signal of the NAND circuit 71 to level LOW.

On the other hand, as the clock signal CLK is brought up to level HIGH, the output signal of the NOR circuit 74 is inverted to level LOW. Therefore, both of the two input terminals of the NOR circuit 73 are brought down to level LOW and the pulse signal CSLEp is brought up to level HIGH. As the pulse signal CSLEp goes up to level HIGH, the transistor NT1 of the inverter circuit INV of the delay circuit 61 is turned on to make the capacitor C starts discharging.

In the initial stages of the electric discharge of the capacitor C, the delay signal DLS is held to level HIGH.

Therefore, the output signal of the NAND circuit 71 is held to level LOW and the pulse signal CSLEp is held to level HIGH regardless of the state of the clock signal CLK. As the discharge of the capacitor C progresses and the delay signal DLS is judged to be at level LOW by the NAND circuit 71, the output signal of the NAND circuit 71 is brought up to level HIGH. As the output signal of the NAND circuit 71 is brought up to level HIGH, the pulse signal CSLEp that is the output signal of the NOR circuit 73 is brought down to level LOW. As the pulse signal CSLEp is brought down to level LOW, the capacitor C in the delay circuit 61 starts to become charged. As the charge of the capacitor C progresses and the delay signal DLS is judged to be at level HIGH by the NAND circuit 71 while the clock signal CLK is at level HIGH, the output signal of the NAND circuit 72 is held to the current state, or level LOW. Therefore, the output signal of the NAND circuit 71 is held to level HIGH and the pulse signal CSLEp is held to level LOW.

On the other hand, as the charge of the capacitor C progresses and the delay signal DLS is judged to be at level HIGH by the NAND circuit while the clock signal CLK is at level LOW, the circuit is initialized in a manner as described above. Then, consequently, the pulse signal CSLEp is held to level LOW and the capacitor C is charged.

Figure 26A:
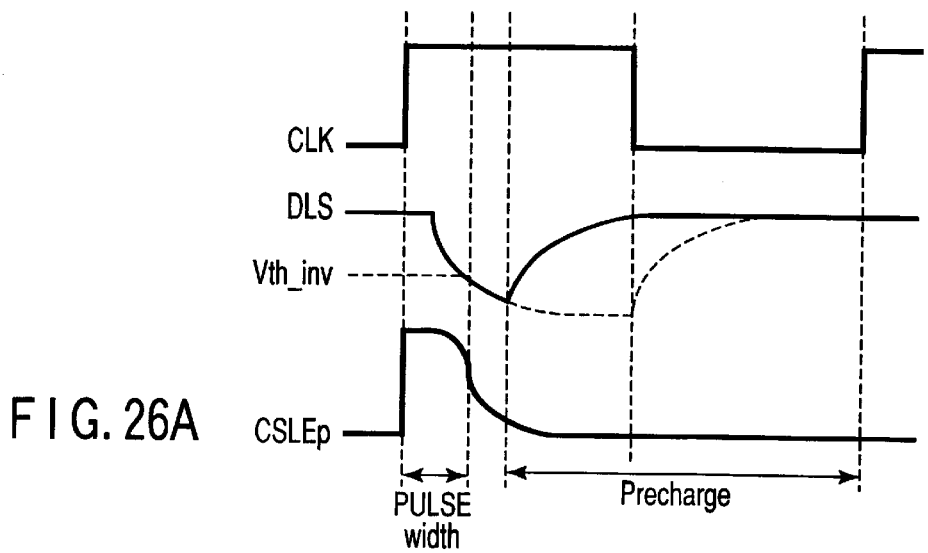
FIG. 26A is a graph of waveforms illustrating the operation of the circuit of FIG. 25
Figure 26B:
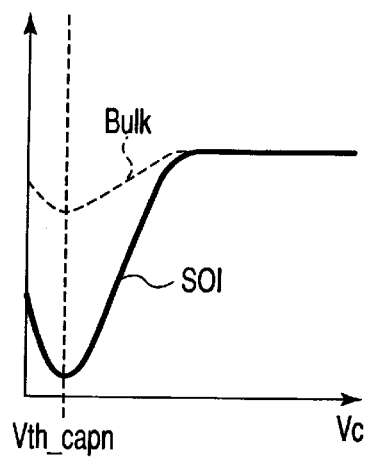
FIG. 26B is a graph illustrating the operating characteristics of the MOS capacitor.

FIG. 26B shows the characteristics of the MOS capacitor. The capacitance of the MOS capacitor is reduced as the discharge of the MOS capacitor progresses and the voltage applied to the MOS capacitor comes close to the threshold voltage Vth_capn of the MOS capacitor. Therefore, the discharge voltage falls as the discharge of the MOS capacitor proceeds. Thus, the discharge output voltage can be prevented from lowering mildly.

In FIG. 26B, the broken line indicates the capacitance when the MOS capacitor is formed within the bulk region and the solid line indicates the capacitance when the MOS capacitor is formed within the SOI region. Thus, the capacitance can be made to fall more sharply by forming the MOS capacitor in the SOI region. Therefore, the delay signal can be made to fall rapidly without using a P-channel MOS transistor PT2 as in the case of the circuit of FIG. 24 by forming the capacitor C in the delay circuit 61 by means of a MOS capacitor and arranging the MOS capacitor in the SOI region.

In the above described ninth embodiment, the output pulse signal of the pulse generator is utilized to charge the capacitor C. Therefore, a sufficiently long charging time can be secured and the capacitor C can be charged quickly. Thus, it is possible to generate a pulse signal highly accurately in a semiconductor integrated circuit the operate at high speed, using a high frequency clock signal CLK.

(10th Embodiment)

Figure 27:
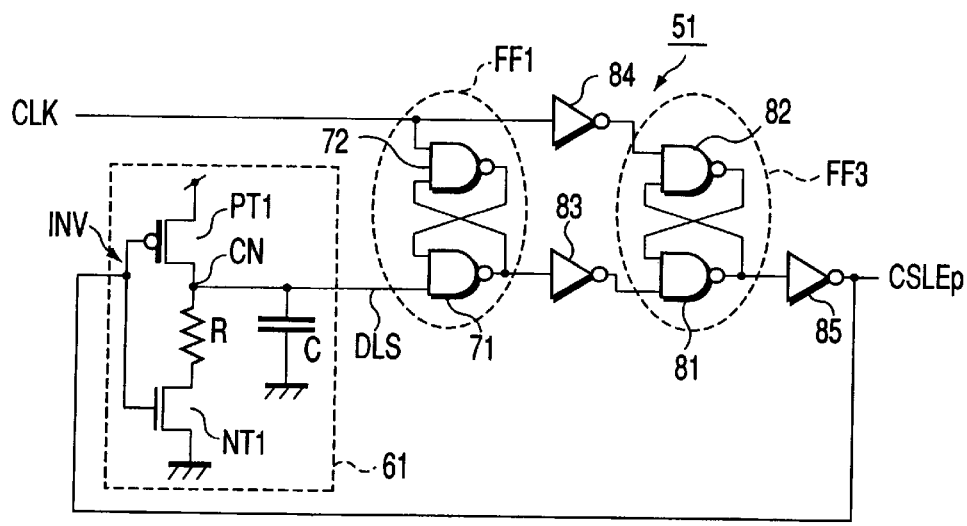
FIG. 27 is a schematic circuit diagram of the pulse generator of the tenth embodiment of the invention.

FIG. 27 schematically illustrates the tenth embodiment of the invention. In FIG. 27, the components same as or similar to those of FIG. 25 are denoted respectively by the same reference symbols. This embodiment will be described only in terms of the difference between this embodiment and that of FIG. 25. The pulse generator 51 of FIG. 27 is realized by using a third flip-flop circuit FF3 that comprises NAND circuits 81, 82 for the logic circuit for generating pulse signal CSLEp in place of the second flip-flop circuit FF2 comprising a NOR circuit. Clock signal CLK is supplied to the first input terminal of the third flip-flop circuit FF3 by way of inverter circuit 84 and the output signal of the first flip-flop circuit FF1 is supplied to the second input terminal of the third flip-flop circuit FF3 by way of inverter circuit 83. The output terminal of the third flip-flop circuit FF3 is connected to inverter circuit 85 and pulse signal CSLEp is output from the output terminal of the inverter circuit 85. The pulse signal CSLEp is supplied to the delay circuit 61.

The waveform of the pulse produced by the operation of the pulse generator 51 of FIG. 27 is similar to the one illustrated in FIG. 26A. Firstly, when the clock signal CLK is at level LOW, the output signal of the NAND circuit 72 is brought up to level HIGH without fail and the NAND circuit 71 operates as inverter circuit that outputs an inverse signal of the delay signal DLS. Additionally, the NAND circuit 82 operates as inverter circuit that outputs an inverse signal of the output signal of the NAND circuit 81. Under this condition, the output signal of the NAND circuit 81 that is inverted by the NAND circuit 82 is supplied to one of the two input terminals of the NAND circuit 81 and the output signal of the NAND circuit 81 that has passed through the inverter circuit 85, the inverter circuit INV, the NAND circuit 71 and the inverter circuit 83 is supplied to the other input terminal of the NAND circuit 81. Thus, the output signal of the NAND circuit 81 is brought up to level HIGH. Therefore, the pulse signal CSLEp output from the inverter circuit 85 is initialized to level LOW.

The transistor PT1 of the inverter circuit INV in the delay circuit 61 is turned on in response to the pulse signal CSLEp and the capacitor C is charged. As a result, the delay signal DLS is brought up to level HIGH.

Thereafter, as the clock signal is brought up to level HIGH, the output signal of the NAND circuit 71 of the first flip-flop circuit FF1 is held to level LOW as long as the clock signal CLK is remains at level LOW.

On the other hand, as the clock signal CLK is brought up to level HIGH, the output signal of the NAND circuit 82 is inverted to level HIGH. As a result, both of the two input signals of the NAND circuit 81 are brought up to level HIGH and the output pulse signal CSLEp is also brought up to level HIGH. As the pulse signal CSLEp gets to level HIGH, the transistor NT1 of the inverter circuit INV in the delay circuit 61 is turned on. Therefore, the capacitor C starts discharging.

In the initial stages of the discharge, the delay signal DLS remains at level HIGH. Therefore, the output signal of the NAND circuit 71 is held to level LOW regardless of the state of the clock signal CLK. Thus, the output pulse signal CSLEp is held to level HIGH.

As the discharge of the capacitor C progresses and the delay signal DLS is judged to be at level LOW by the NAND circuit 71, the output signal of the NAND circuit 71 is brought up to level HIGH. As the output signal of the NAND circuit 71 is brought up to level HIGH, the output signal of the NAND circuit 81 is also brought up to level HIGH and therefore the output pulse signal CSLEp is brought down to level LOW. As the output pulse signal CSLEp gets to level LOW, the capacitor C of the delay circuit 61 starts to be charged. As the charge of the capacitor C progresses and the delay signal DLS is judged to be at level HIGH by the NAND circuit 71, the output signal of the NAND circuit 72 maintains its current level LOW so long as the clock signal CLK is at level HIGH. As long as the clock signal CLK is at level HIGH, the output signal of the NAND circuit 71 is held to level HIGH and the output pulse signal CSLEp is held to level LOW.

As the charge of the capacitor C progresses and the delay signal DLS is judged to be at level HIGH by the NAND circuit 71 while the clock signal CLK is at level LOW, the circuit is initialized in a manner as described above. Then, consequently, the pulse signal CSLEp is held to level LOW and the capacitor is charged.

The above described tenth embodiment provides advantages similar to those of the ninth embodiment.

(11th Embodiment)

Figure 28:
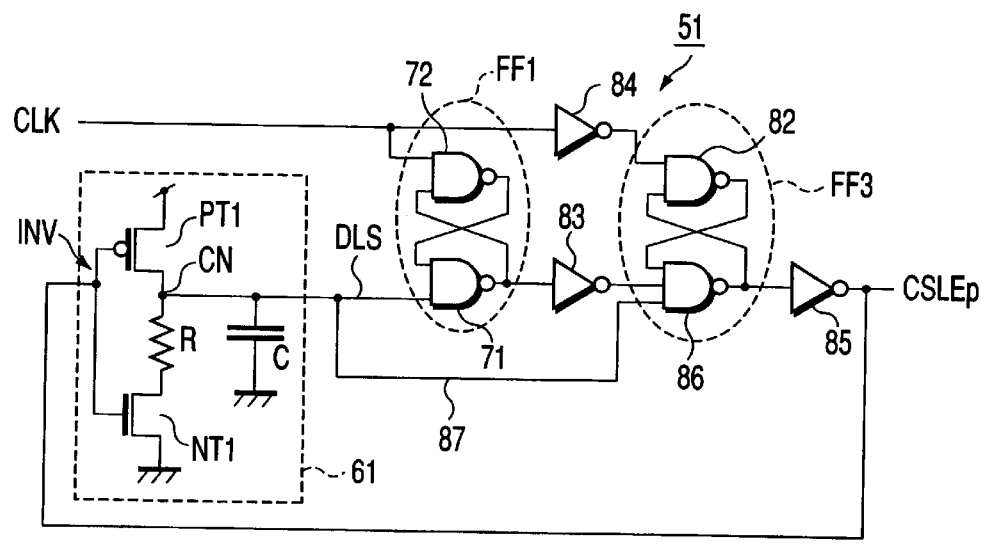
FIG. 28 is a schematic circuit diagram of the pulse generator of the eleventh embodiment of the invention.

FIG. 28 schematically illustrates the eleventh embodiment of the invention, which is obtained by modifying the tenth embodiment. In FIG. 28, the components same as or similar to those of FIG. 27 are denoted respectively by the same reference symbols. This embodiment will be described only in terms of the difference between this embodiment and that of FIG. 27.

Referring to FIG. 28, the third flip-flop circuit FF3 comprises a 3-input NAND circuit 86. The output signal of the NAND circuit 82, the output signal of the inverter circuit 83 and the output signal of the delay circuit 61 are supplied to the respective input terminals of the NAND circuit 86.

With the eleventh embodiment, the delay signal DLS output from the delay circuit 61 is directly supplied to the NAND circuit 86. Thus, the signal for inverting the output signal of the third flip-flop circuit FF3 does not pass through the NAND circuit 71 and the inverter circuit 83. Therefore, this embodiment provides an additional advantage that, when the output pulse signal CSLEp is raised, the delay time from the rising edge does not heavily rely on the supply voltage.

(12th Embodiment)

Figure 29:
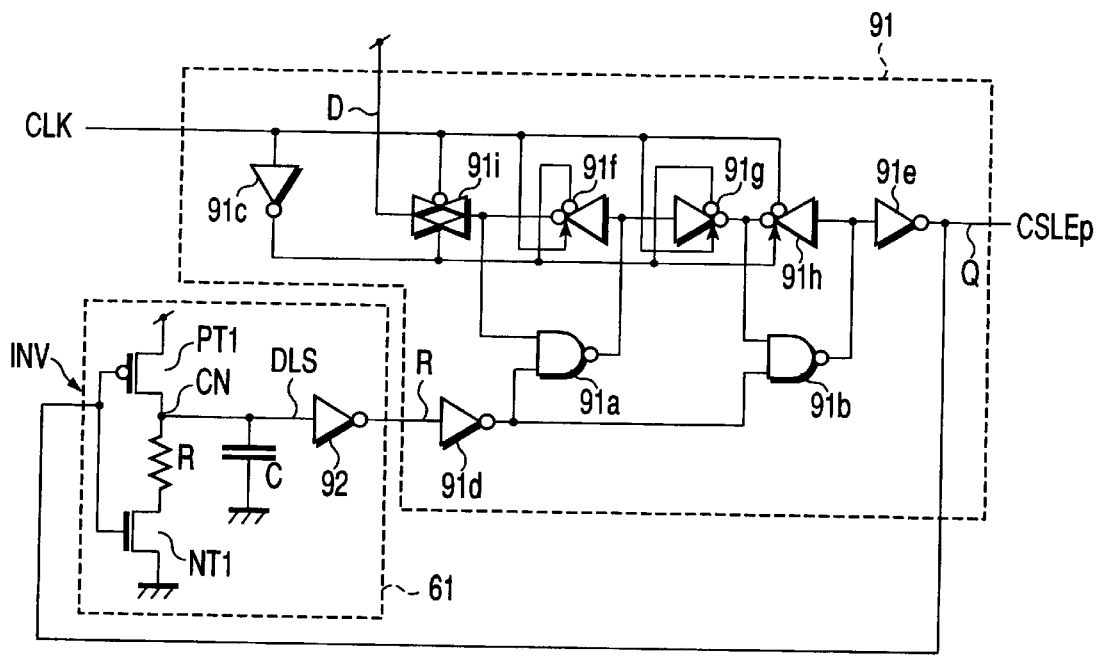
FIG. 29 is a schematic circuit diagram of the pulse generator of the twelfth embodiment of the invention.

FIG. 29 schematically illustrates the twelfth embodiment of the invention. Referring to FIG. 29, a master/slave type delay flip-flop circuit 91 having a reset input signal is connected to the output terminal of the delay circuit 61. The pulse signal CSLEp output from the master/slave type delay flip-flop circuit 91 is supplied to the delay circuit 61. The master/slave type delay flip-flop circuit 91 has NAND circuits 91a, 91b, inverter circuits 91c, 91d, 91e, clocked inverter circuits 91f, 91g, 91h and a transfer gate 91i. The NAND circuit 91a and the clocked inverter circuit 91f constitute a master cell, while the NAND circuit 91b and the clocked inverter circuit 91h constitute a slave cell. The delay circuit 61 has an inverter circuit 92 for inverting the delay signal DLS.

Figure 30:
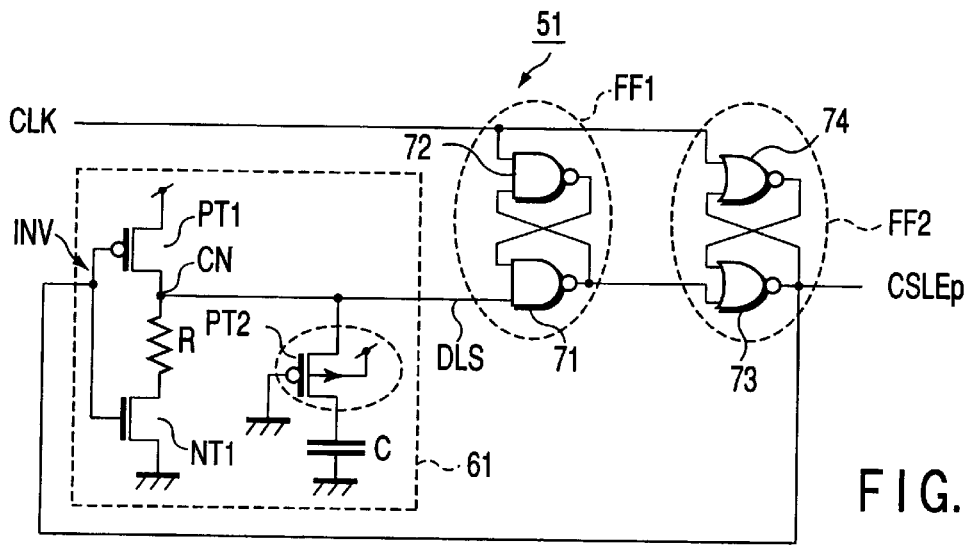
FIG. 30 is an illustration of the operation of the circuit of FIG. 29.

FIG. 30 shows the characteristics of a master/slave type delay flip-flop circuit having a reset input signal. In other words, FIG. 30 illustrates the relationship among the reset input signal R, input signal D, output signal Q and the clock signal CLK.

Now, the operation of the embodiment of FIG. 29 will be described by referring to FIG. 30. The input signal D of the master/slave type delay flip-flop circuit 91 is fixed to level HIGH. Therefore, as the clock signal CLK is brought up from level LOW to level HIGH, the output signal Q (pulse signal CSLEp) is also brought up to level HIGH. The output signal Q at level HIGH is delayed by a time period equal to a predetermined pulse width by the delay circuit 61 and operates as reset input signal R. Thus, the output signal Q is brought down to level LOW with a delay time equal to the pulse width. The output signal Q that is brought down to level LOW passes again through the delay circuit 61 and becomes a reset input signal R. At this time, the output signal of the master cell of the master/slave type delay flip-flop circuit 91 has already been initialized by the reset signal R if the clock signal is at level HIGH. Thus, the output signal Q remains at level LOW. Additionally, output signal of the delay flip-flop circuit 91 is held to level LOW and, at the same time, the capacitor C is charged if the clock signal is at level LOW.

With the twelfth embodiment, a pulse signal CSLEp can be generated quickly by using a master/slave type delay flip-flop circuit having a reset input signal.

(13th Embodiment)

Figure 31:
FIG. 31 is a schematic circuit diagram of the pulse generator of the thirteenth embodiment of the invention.

FIG. 31 schematically illustrates the thirteenth embodiment of the invention. This thirteenth embodiment is formed by combining the delay circuit 61 shown in FIG. 20 and the first and second flip-flop circuits FF1, FF2 shown in FIG. 25. In FIG. 31, the components same as or similar to those of FIGS. 20 and 25 are denoted respectively by the same reference symbols.

The embodiment of FIG. 31 operates substantially same as the ninth embodiment of FIG. 25. However, the falling edge of the delay signal DLS of this thirteenth embodiment is sharper than that of the delay signal DLS of the ninth embodiment.

Figure 32:
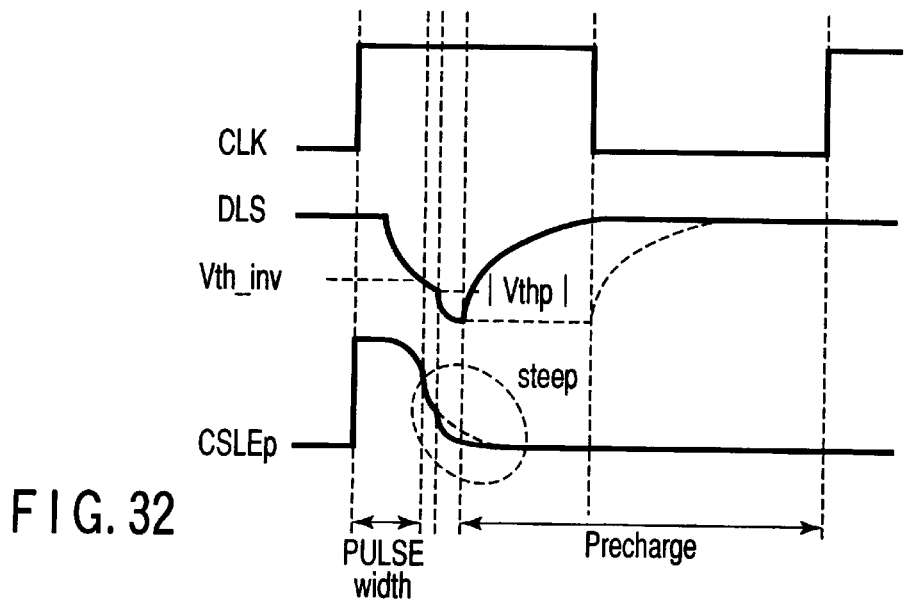
FIG. 32 is a graph of waveforms illustrating the operation of the circuit of FIG. 31.

More specifically, as shown in FIG. 32, when the capacitor C of the delay circuit 61 discharges, the transistor PT2 is turned off as the potential of the delay signal DLS falls under the threshold voltage |Vthp| of the P-channel MOS transistor PT2. Thus, the capacitor C is isolated from the connection node CN so that the potential of the delay signal DLS can be made to fall quickly by the inverter INV. Therefore, the delay signal DLS shows a sharp falling edge so that the supply voltage dependency of the pulse width of the output pulse signal can be reduced if compared with a signal showing a mild falling edge.

The pulse generator of this embodiment operates at very high speed and is little dependent on the supply voltage as a result of the effect of combining the advantages of the sixth embodiment and those of the ninth embodiment.

(14th Embodiment)

Figure 33:
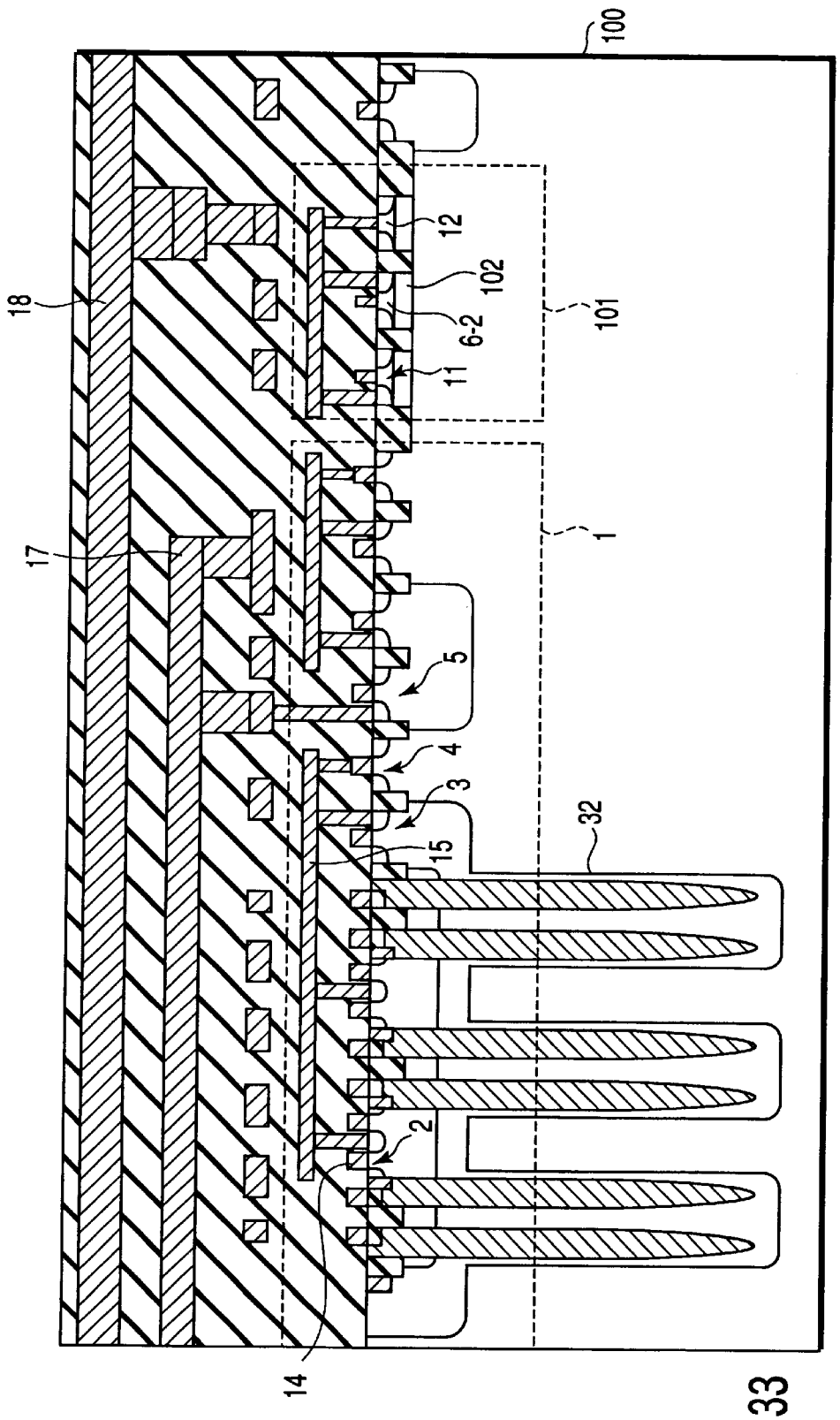
FIG. 33 is a schematic cross sectional view of a part of the DRAM macro of the fourteenth embodiment of the invention.

FIG. 33 schematically illustrates the fourteenth embodiment of the invention. The word line selection circuit 7, the column selection circuit 9, the row decoder 52, the column decoder 53 and the pulse generator 51 of the first through thirteenth embodiments are arranged in the SOI region 6. However, the disposition of these components is not limited to the inside of the SOI region.

The embodiment of FIG. 33 is realized by applying the present invention to SON (silicon on nothing). In FIG. 33, the components same as or similar to those of FIG. 9 are denoted respectively by the same reference symbols. Referring to FIG. 33, an SON region 101 is arranged in the substrate 100. MOS transistors operating for data latch circuits 11 and a main data line drive circuit 12 are formed in the respective semiconductor layers 6-2 of the substrate 100 within the SON region 101. The MOS transistors are isolated from each other by means of STIs. Cavity regions 102 are formed respectively under the semiconductor layers 602.

The above described SON structure provides the advantages described above by referring to the SOI structure.

The sixth through twelfth embodiments are described in terms of generation of a column-related pulse signal. However, the present invention is by no means limited thereto and can equally be applied to generation of a pulse signal that is used in for parts of a semiconductor device.

Preferably, the circuits that are arranged in the bulk region 1 and those arranged in the SOI region 6 or SON region 101 are configured in a manner as described above by referring to the embodiments. However, alternatively, the circuits relating to the reading operation of the device may be arranged in the bulk region 1 and those relating to the writing operation of the device may be arranged in the SOI region 6 or SON region 101. Such an arrangement also provides advantages similar to those of the above described embodiments.

The above embodiments are described in terms of forming a DRAM macro by using the partial SOI or SON technology. However, the present invention is by no means limited thereto and the present invention may be applied to memory devices other than DRAMs, such as SRAMs, EPROMs, EEPROMs and ferroelectric memory devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device formed in a region other than the bulk region within a semiconductor substrate, said device comprising:

a delay circuit adapted to be supplied with a clock signal and delay the clock signal;

a logic circuit adapted to be supplied with the output signal of said delay circuit and said clock signal;

said delay circuit including:
an inverter circuit for receiving said clock signal;
a capacitor to be charged and discharged in response to the operation of said inverter circuit; and
a transistor connected to said capacitor and the output terminal of said inverter circuit, said transistor being turned off in response to a fall of the output voltage of said inverter circuit under the threshold voltage of said inverter circuit.

2. The device according to claim 1, wherein said capacitor is inserted between the output terminal of said inverter circuit and the ground and said transistor is a P-channel MOS transistor.

3. The device according to claim 1, wherein said capacitor is inserted between the output terminal of said inverter circuit and the power source and said transistor is a N-channel MOS transistor.

4. The device according to claim 2, wherein said capacitor is a MOS capacitor.

5. A semiconductor device formed in a region other than the bulk region within a semiconductor substrate, said device comprising:

a delay circuit for delaying a signal;

first and second latch circuits for alternately holding the output signal of said delay circuit in response to a clock signal, said second latch circuit being adapted to supply the signal held by itself to said delay circuit;

said delay circuit including:
an inverter circuit for receiving the output signal of said second latch circuit; and
a capacitor connected to the output terminal of said inverter circuit.

6. The device according to claim 5, wherein said first latch circuit is a first flip-flop circuit formed by using two NAND circuits.

7. The device according to claim 5, wherein said second latch circuit is a second flip-flop circuit formed by using two OR circuits.

8. The device according to claim 5, wherein said second latch circuit is a third flip-flop circuit formed by using two NAND circuits, said third flip-flop circuit having first and second input terminals, said first input terminal being adapted to be supplied with an inverted clock signal, said second input terminal being adapted to be supplied with an inverted output signal of said first flip-flop circuit.

9. The device according to claim 8, wherein said third latch circuit includes a 3-input NAND circuit and the output signal of said inverter circuit is directly supplied to the first input terminal of said 3-input NAND circuit.

10. The device according to claim 5, wherein said first and second latch circuits being master/slave type delay flip-flop circuits.

11. The device according to claim 5, further comprising:
a transistor connected between the output terminal of said inverter circuit and the said capacitor, said transistor being turned off when the output signal of said inverter circuit is lower than the threshold voltage of said inverter circuit.

12. The device according to claim 5, wherein said capacitor is a MOS capacitor.

* * * * *

UNITED STATES PATENT AND TRADEMARK OFFICE
CERTIFICATE OF CORRECTION

PATENT NO.   : 6,744,680 B2
DATED        : June 1, 2004
INVENTOR(S)  : Toshimasa Namekawa et al.

It is certified that error appears in the above-identified patent and that said Letters Patent is hereby corrected as shown below:

Column 24,
Line 16, please change "OR" to -- NOR --
Lines 24-25, please change "third latch circuit" to -- third flip-flop circuit --

Signed and Sealed this

Seventeenth Day of August, 2004

JON W. DUDAS
*Acting Director of the United States Patent and Trademark Office*